(12) United States Patent
Oveis Gharan et al.

(10) Patent No.: US 11,233,523 B1
(45) Date of Patent: Jan. 25, 2022

(54) DIGITAL-TO-ANALOG CONVERSION WITH SIGN MODULATION

(71) Applicants: Shahab Oveis Gharan, Ottawa (CA); Ian Roberts, Ottawa (CA); Yuriy Greshishchev, Ottawa (CA); Naim Ben-Hamida, Ottawa (CA); Kim B. Roberts, Ottawa (CA)

(72) Inventors: Shahab Oveis Gharan, Ottawa (CA); Ian Roberts, Ottawa (CA); Yuriy Greshishchev, Ottawa (CA); Naim Ben-Hamida, Ottawa (CA); Kim B. Roberts, Ottawa (CA)

(73) Assignee: Ciena Corporation, Hanover, MD (US)

( * ) Notice: Subject to any disclaimer, the term of this patent is extended or adjusted under 35 U.S.C. 154(b) by 0 days.

(21) Appl. No.: 17/158,373

(22) Filed: Jan. 26, 2021

(51) Int. Cl.
*H03M 1/66* (2006.01)
*H03M 1/82* (2006.01)

(52) U.S. Cl.
CPC .............. *H03M 1/662* (2013.01); *H03M 1/82* (2013.01)

(58) Field of Classification Search
CPC ................................ H03M 1/662; H03M 1/82
USPC .................................................. 341/141, 144
See application file for complete search history.

(56) References Cited

U.S. PATENT DOCUMENTS

| | | |
|---|---|---|
| 6,781,537 B1 | 8/2004 | Taraschuk et al. |
| 7,277,603 B1 | 10/2007 | Roberts et al. |
| 8,237,595 B2 * | 8/2012 | Petrovic ............. H03M 1/0614 341/144 |
| 8,693,876 B2 | 4/2014 | Krause et al. |
| 10,374,623 B1 | 8/2019 | Oveis Gharan et al. |
| 10,666,285 B1 * | 5/2020 | Mehdizad Taleie .. H03M 1/662 |

OTHER PUBLICATIONS

Huang., et al., "An 8-bit 100-GS/s Distributed DAC in 28-nm CMOS for Optical Communications", IEEE Transactions an Microwave Theory and Techniques, Apr. 2015, vol. 63, issue. 4, 8 pages.
Nagatani et al., "A 50-GHz-Bandwidth InP-HBT Analog-MUX Module for High-Symbol-Rate Optical Communications Systems", 2016 IEEE MTT-S International Microwave Symposium (IMS).
Yamazaki et al., "160-Gbps Nyquist PAM4 Transmitter Using a Digital-Preprocessed Analog-Multiplexed DAC", ECOC 2015.
Yamazaki H., et al., "Ultra-Wideband Digital-to-Analog Conversion Technologies for Tbit/s channel transmission", European Conference on Optical Communication (ECOC), Sep. 2017, 3 pages.

* cited by examiner

*Primary Examiner* — Khai M Nguyen
(74) *Attorney, Agent, or Firm* — Integral Intellectual Property Inc.; Amy Scouten; Miriam Paton

(57) ABSTRACT

An apparatus is configured to generate, from a stream of periodic digital samples, a first sub-stream of periodic analog samples and a second sub-stream of periodic analog samples, each sub-stream comprising substantially stable time intervals. The apparatus is further configured to generate a sign-modulated sub-stream by applying to the second sub-stream a sign modulation operation effecting a sign transition during a stable time interval of the second sub-stream. The apparatus is further configured to generate an output stream of periodic analog samples based on a sum of the first sub-stream and the sign-modulated sub-stream, wherein a period of the output stream is shorter than periods of the first and second sub-streams.

20 Claims, 11 Drawing Sheets

DIGITAL-TO-ANALOG CONVERSION WITH SIGN MODULATION

TECHNICAL FIELD

This disclosure is related to the technical field of generating analog signals and digital-to-analog conversion.

BACKGROUND

"Ultra-Wideband Digital-to-Analog Conversion Technologies for Tbit/s channel transmission" by Yamazaki et al, presented at ECOC 2017, notes that "high-speed electronic digital-to-analog converters (DACs) are of key importance in modern optical transmission systems" and "in multilevel optical transmitters, the analog bandwidth of the DACs is one of the factors limiting the transmitter's bandwidth". Yamazaki et al. describes a digital-preprocessed analog-multiplexed DAC (DP-AM-DAC) that uses a digital preprocessor, two sub-DACs, and an analog multiplexer (AMUX). "With sub-DACs with a bandwidth of $\sim\frac{1}{2}f_B$, we can generate signals with a bandwidth of $\sim f_B$ as the output from the AMUX." The AMUX is a heterojunction bipolar transistor (HBT) analog multiplexer (mux). FIG. 2 of Yamazaki et al. shows an interleaving method (type I) and a preprocessed spectrum method (type II) that reduces the switching frequency of the analog mux by a factor of two. However, type II is very sensitive to imperfections of the matching of the analog characteristics of the two inputs of the analog mux, as very large signal components need to be almost-perfectly cancelled.

"An 8-bit 100-GS/s Distributed DAC in 28-nm CMOS for Optical Communications" by Huang et al., *IEEE Transactions on Microwave Theory and Techniques*, vol. 63, no. 4 (April 2015), discloses a distributed structure to interleave together the outputs from two DACs. Huang et al. uses two interleaved NRZ (non-return-to-zero) DACs sampled at 90 degrees out of phase with respect to each other and summed up at the output stage. The interleaving is structured to invert one of the image spectra so that they are cancelled when summed. Again, there are very strong interference terms that are suppressed only with precise matching of the two halves of the analog circuit.

U.S. Pat. No. 8,693,876 to Krause et al. discloses the combining of two half-band signals from two DACs into a full-band signal, by shifting up the frequency of one of the half-band signals with a bipolar mixer. It is desirable to have the circuit implemented using lower energy technologies such as complementary metal-oxide-semiconductor (CMOS).

Packet and burst switches are known, where typically 1500 bytes received from one tributary are sent in sequence out of one optical or electrical output.

SUMMARY

According to a broad aspect, an apparatus comprises circuitry configured to generate, from a stream of periodic digital samples, a first sub-stream of periodic analog samples and a second sub-stream of periodic analog samples, each sub-stream comprising substantially stable time intervals. The apparatus further comprises circuitry configured to generate a sign-modulated sub-stream by applying to the second sub-stream a sign modulation operation effecting a sign transition during a stable time interval of the second sub-stream. The apparatus further comprises circuitry configured to generate an output stream of periodic analog samples based on a sum of the first sub-stream and the sign-modulated sub-stream, wherein a period of the output stream is shorter than periods of the first and second sub-streams.

According to some examples, the sign modulation operation effects a plurality of sign transitions during a respective plurality of stable time intervals of the second sub-stream, each sign transition occurring at approximately the middle of a respective stable time interval.

According to some examples, the sign modulation operation effects a plurality of sign transitions during a respective plurality of stable time intervals of the second sub-stream, the plurality of sign transitions occurring at regular offset times within the plurality of stable time intervals.

According to some examples, each sample of the first sub-stream is generated from a sum of two of the digital samples, and each sample of the second sub-stream is generated from a difference between two of the digital samples.

According to some examples, the periods of the first and second sub-streams are equal.

According to some examples, the apparatus further comprises circuitry configured to generate one or more additional sub-streams of periodic analog samples from the stream of periodic digital samples, each additional sub-stream comprising substantially stable time intervals, circuitry configured to generate at least one additional sign-modulated sub-stream from the one or more additional sub-streams by effecting sign transitions during stable time intervals of at least one of the one or more additional sub-streams, and circuitry configured to generate the output stream as a function of the at least one additional sign-modulated sub-stream.

According to some examples, the apparatus further comprises circuitry configured to generate a plurality of input streams from the first sub-stream, the sign-modulated sub-stream, and the one or more additional sign-modulated sub-streams, and circuitry configured to generate the output stream by applying a multiplexing operation to the plurality of input streams.

According to some examples, the apparatus further comprises circuitry configured to generate the output stream from a sum of the first sub-stream, the sign-modulated sub-stream, and the at least one additional sign-modulated sub-stream.

According to some examples, the sign modulation operation comprises a multiplexing operation driven by a clock signal.

According to some examples, the sign modulation operation comprises multiplication by a substantially square clock signal.

DETAILED DESCRIPTION

Figure 1:
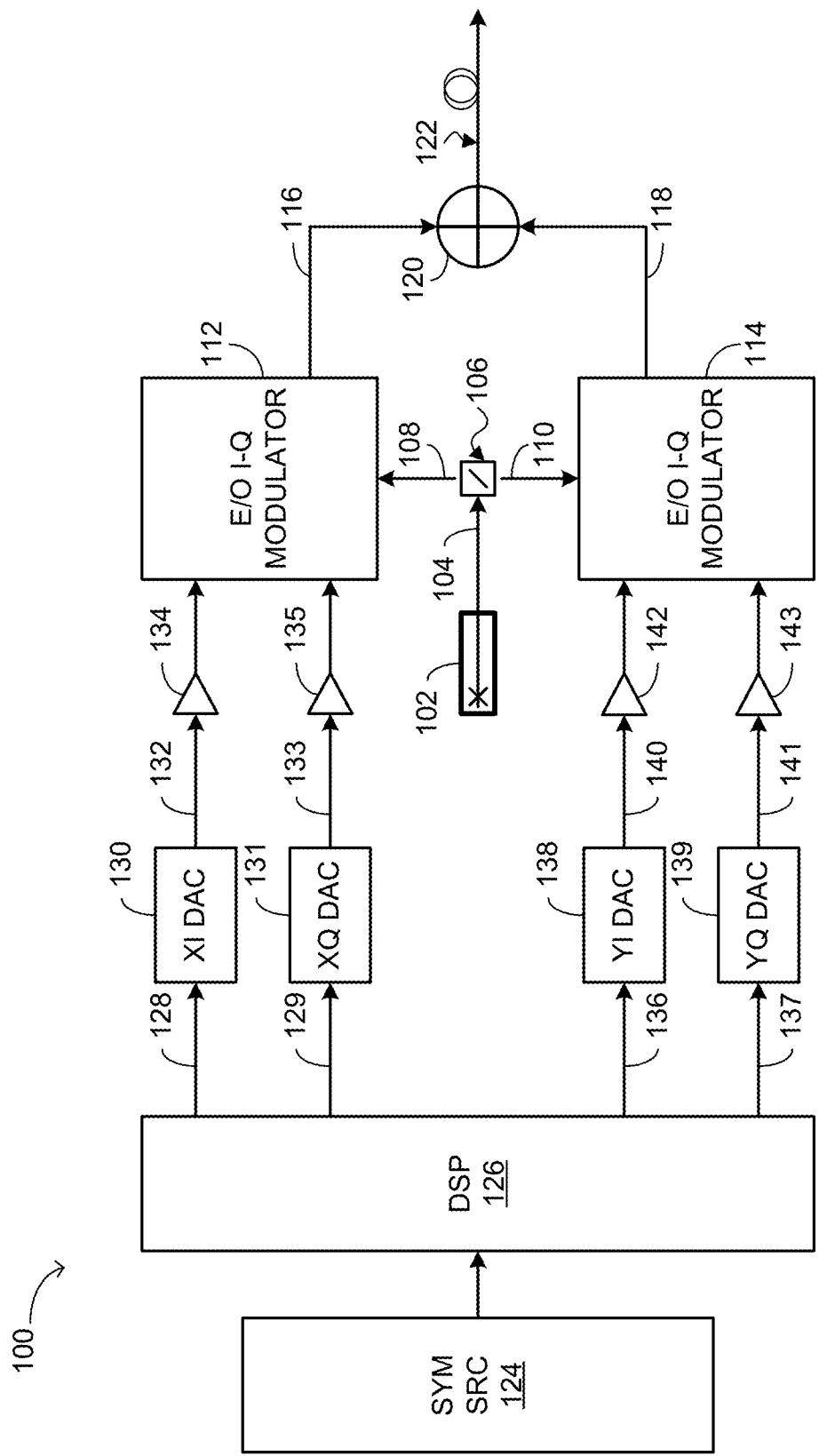
FIG. 1 is a block diagram illustration of an example transmitter.

FIG. 1 is a block diagram illustration of an example transmitter 100 that employs polarization-division multiplexing (PDM). A laser 102 is operative to generate a continuous wave (CW) optical carrier 104. A polarizing beam splitter 106 is operative to split the CW optical carrier 104 into orthogonally-polarized components 108, 110 (nominally referred to as the "X-polarization" component and the "Y-polarization" component) that are modulated by respective electrical-to-optical modulators 112, 114 to produce modulated polarized optical signals 116, 118 that are combined by a beam combiner 120, thus yielding an optical signal 122.

A symbol source 124 is operative to generate a stream of symbols representing data to be transmitted in the optical signal 122. A digital signal processor (DSP) 126 is operative to process the symbols output from the symbol source 124, for example, performing one or more of pulse shaping, subcarrier multiplexing, chromatic dispersion pre-compensation, and distortion pre-compensation on the symbols. The DSP 126 is operative to generate I and Q digital drive signals 128, 129 for the X-polarization to be converted by DACs 130, 131, respectively, into I and Q analog drive signals 132, 133 for the X-polarization that, after amplification by respective amplifiers 134, 135, are used to drive the electrical-to-optical modulator 112. The DSP 126 is operative to generate I and Q digital drive signals 136, 137 for the Y-polarization to be converted by DACs 138, 139, respectively, into I and Q analog drive signals 140, 141 for the Y-polarization that, after amplification by respective amplifiers 142, 143, are used to drive the electrical-to-optical modulator 114.

Each of the DACs 130, 131, 138, 139 is operative to produce a high-bandwidth analog signal at a sample rate of $F_S$. For example, the I and Q analog drive signals 132, 133 for the X-polarization may comprise an output stream of analog samples $A=\{A_0, A_1, A_2, A_3, \ldots\}$ that contains one analog sample in each time period of duration $\sim T_S$. The symbol "~" is shorthand for the word "approximately". The index i of each analog sample $A_i$ represents an order of the analog samples in the stream A. The output stream of analog samples $A=\{A_0, A_1, A_2, A_3, \ldots\}$ may be generated from a respective input stream of digital samples $D=\{D_0, D_1, D_2, D_3, \ldots\}$, where the index i of each digital sample $D_i$ represents an order of the digital samples in the stream D.

In some implementations, the DSP 126 and the DACs 130, 131, 138, 139 are comprised in a CMOS module, and the amplifiers 134, 135, 142, 143 are comprised in a BiCMOS module.

Figure 2:
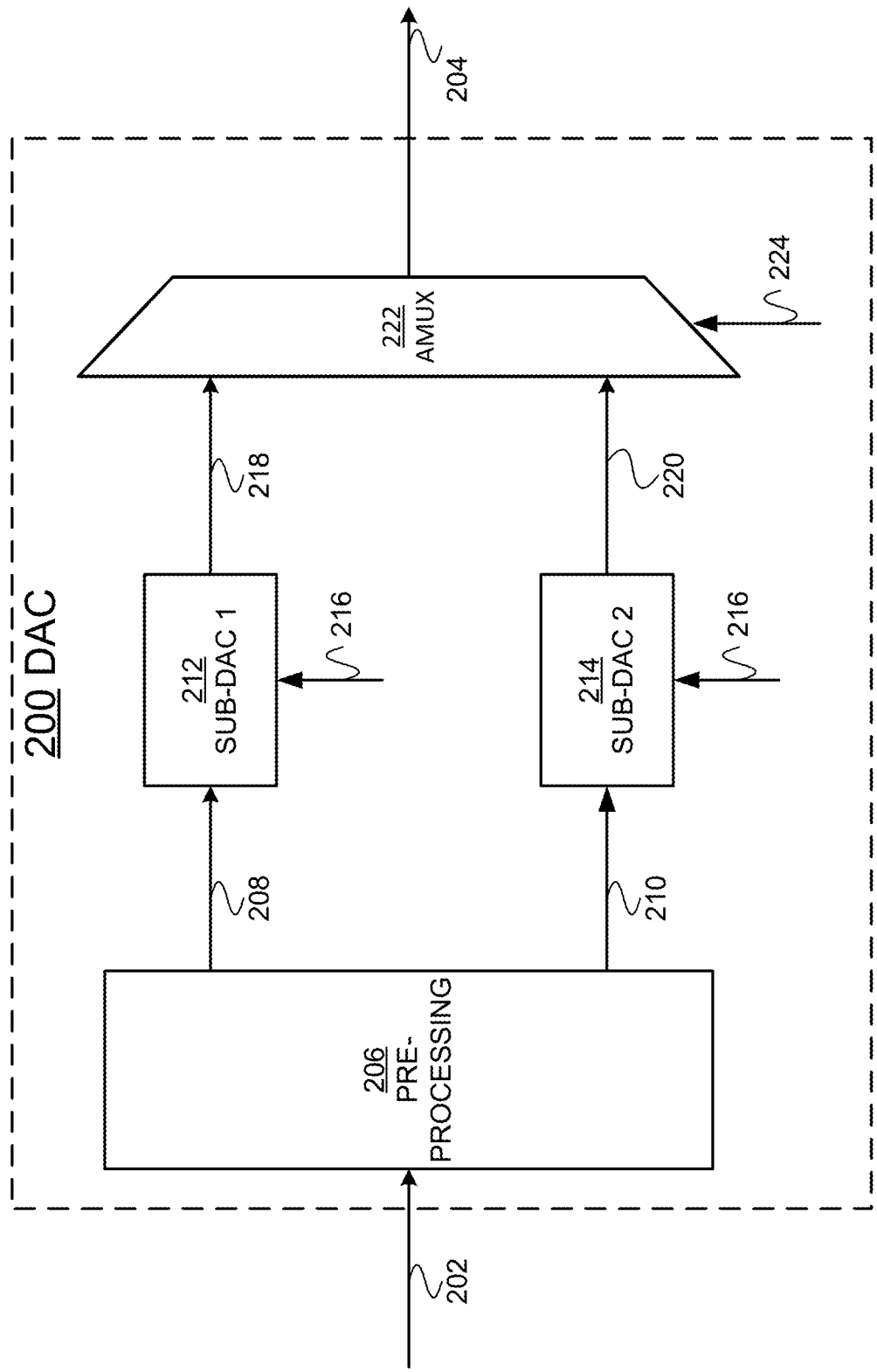
FIG. 2 illustrates a digital-to-analog converter (DAC) in accordance with PRIOR ART.

FIG. 2 illustrates a DAC 200 in accordance with an example of PRIOR ART. The DAC 200 is operative to convert an input stream 202 of digital samples into an output stream 204 of analog samples at a sampling rate of F. The DAC 200 comprises a pre-processing module 206, a first sub-DAC component 212, a second sub-DAC component 214, and an analog multiplexer (AMUX) component 222. The pre-processing module generates digital sub-streams 208, 210 from the input stream 202. A primary function of the pre-processing module 206 is signal multiplexing from a data rate suitable to the ASIC digital core, to a data rate of $F_S/2$ in each sub-DAC component.

A clock signal 216 is provided to each of the sub-DAC components 212, 214, which are configured to sample the digital sub-streams 208, 210 at rising edges and falling edges of the clock signal 216, thus converting the digital sub-stream 208, 210 into respective analog sub-streams 218, 220. The analog sub-streams 218, 220 are input to the AMUX component 222, which is controlled by a clock signal 224.

A DAC with a traditional 2:1 multiplexer architecture, such as the DAC 200, requires a minimum clock frequency of $\sim F_S/2$ in order to convert digital samples to analog samples having a sample period $\sim T_S$. Although this 2:1 multiplexer architecture allows the required clock frequency to be reduced by half, it is still a challenge to generate a high-speed clock approaching hundreds of GHz and beyond. Furthermore, an analog 2:1 multiplexer component controlled by a high-speed clock consumes power that is proportional to the clock speed. There remains a need for DAC architectures and methods that are capable of achieving high-bandwidth and low-distortion digital-to-analog conversion using clock frequencies lower than $F_S/2$.

The example DACs described in this document could be used as any of the DACs 130, 131, 138, 139 in the transmitter 100 or in some other electronic apparatus operative to perform high-bandwidth digital-to-analog conversion.

Figure 3:
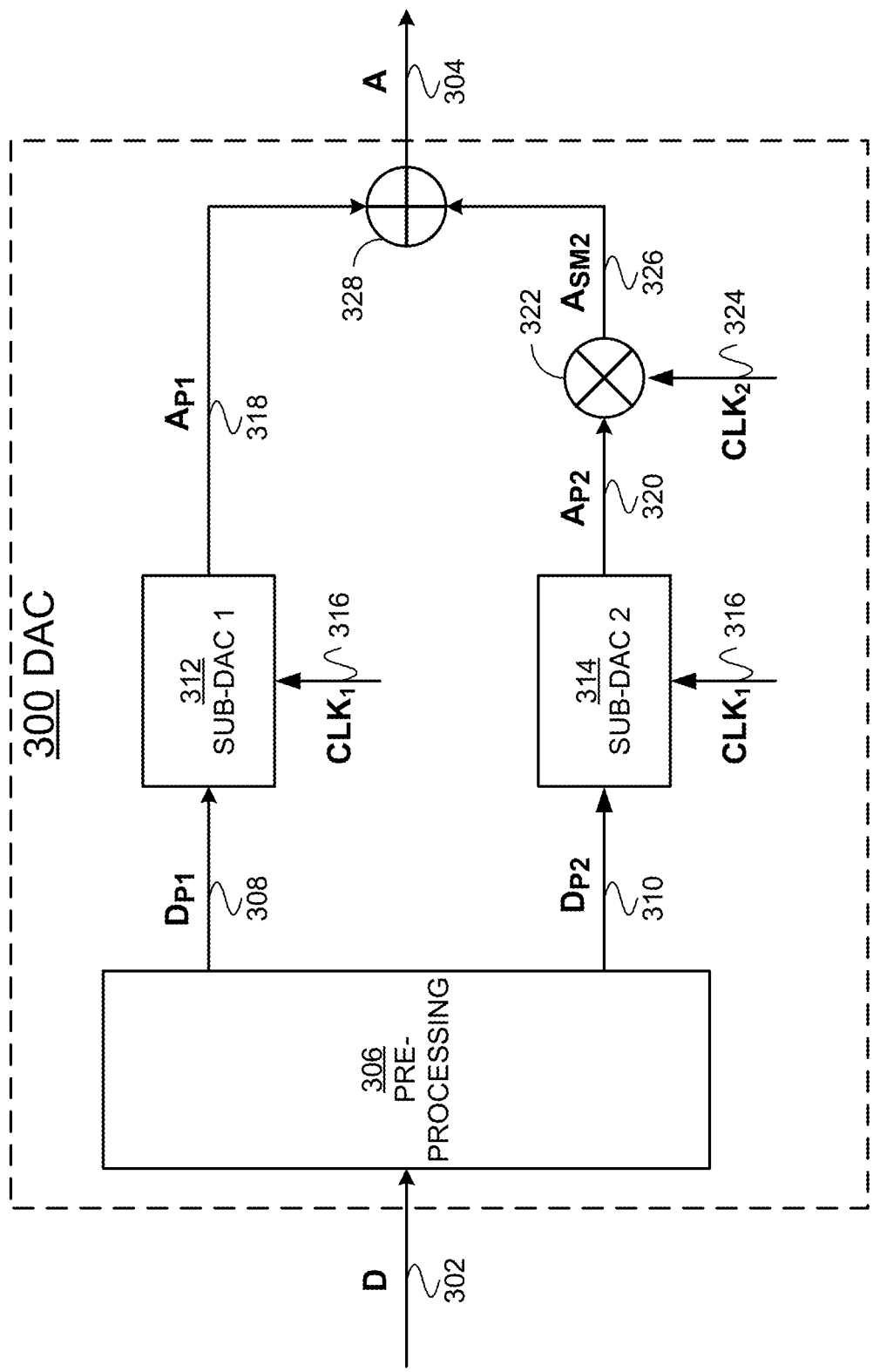
FIG. 3 illustrates a first DAC in accordance with some examples of the proposed technology.
Figure 4:
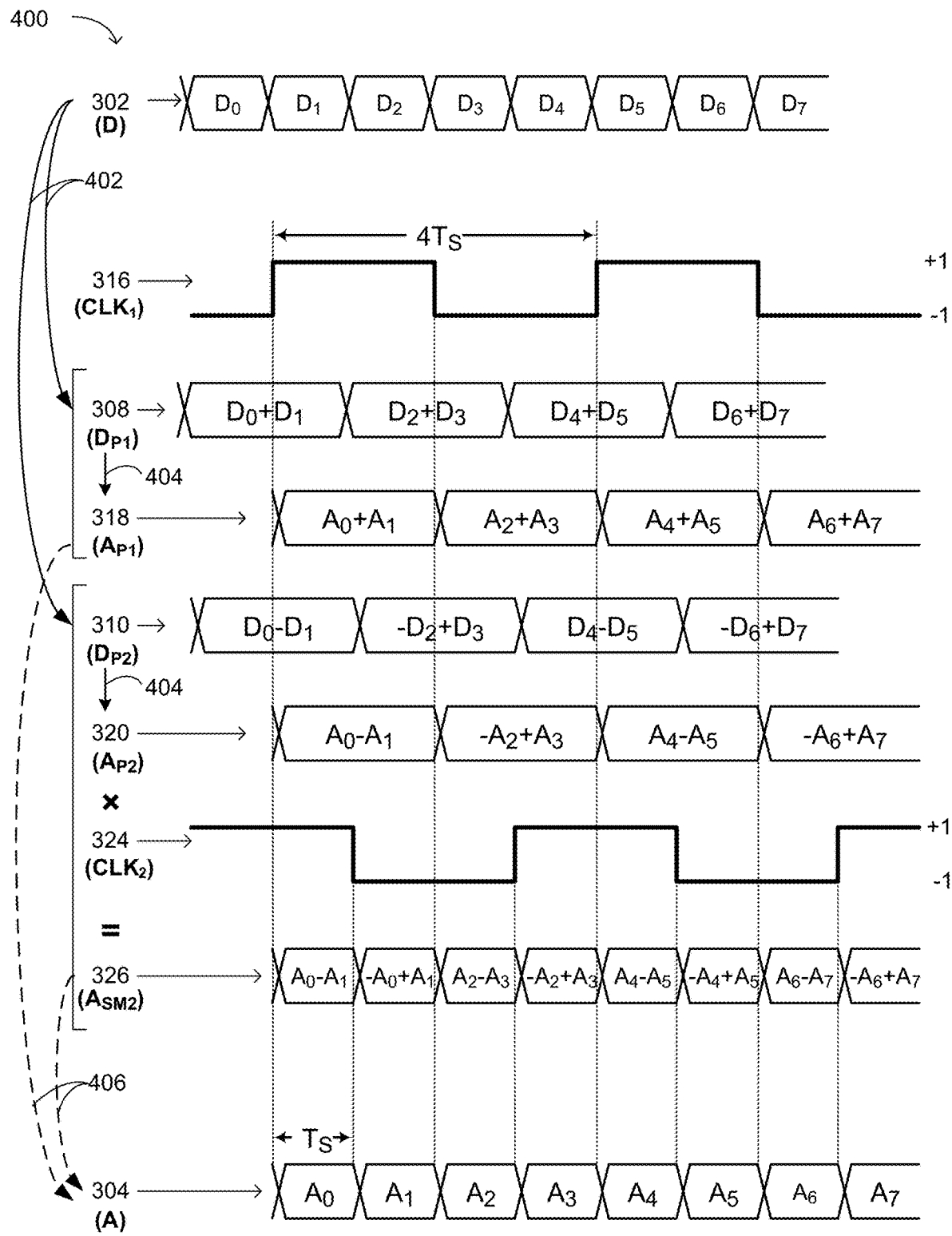
FIG. 4 is a timing diagram of clock signals and data signals in the first DAC of FIG. 3.

FIG. 3 illustrates an example digital-to-analog converter (DAC) 300 that is operative to convert an input stream 302 of digital samples D into an output stream 304 of analog samples A at a sampling rate of $F_S$. FIG. 4 is a timing diagram of clock signals and data signals in the DAC 300.

The DAC 300 comprises a pre-processing module 306, a first sub-DAC component 312, a second sub-DAC component 314, a sign modulation component 322, and a summation component 328.

The pre-processing module 306, which may be implemented in hardware, is operative to calculate, from terms of the input stream 302 of digital samples D, a first processed sub-stream 308 of digital samples $D_{P1}$ and a second processed sub-stream 310 of digital samples $D_{P2}$. In this example, each term of the first sub-stream 308 is equal to the sum of a pair of adjacent digital samples of the input stream 302, while each term of the second sub-stream 310 is equal to a difference between a pair of adjacent digital samples of the input stream 302. That is, as illustrated in the timing diagram of FIG. 4, for an input stream 304 of digital samples $D=\{D_0, D_1, D_2, D_3, \ldots\}$, the first processed sub-stream 308 generated by the pre-processing module 306 comprises the digital samples $D_{P1}=\{(D_0+D_1), (D_2+D_3), (D_4+D_5), (D_6+D_7), \ldots\}$, and the second processed sub-stream 310 generated by the pre-processing module 306 comprises the digital samples $D_{P2}=\{(D_0-D_1), (-D_2+D_3), (D_4-D_5), (-D_6+D_7), \ldots\}$. Each term of $D_{P1}$, $D_{P2}$ has a substantially stable time interval of $\sim 2T_S$. The generation of the processed sub-streams 308, 310 from the input stream 302 is represented by the arrows 402. According to some examples, a bus of digital samples D, may be passed in parallel to the pre-processing module 306 at a slower period and then processed sequentially to generate the processed sub-streams 308, 310.

A clock signal $CLK_1$ 316 operating at $\frac{1}{4}F_S$ (and therefore having a period of $\sim 4T_S$) is provided to each of the sub-DAC components 312, 314. The first sub-DAC component 312 samples the first sub-stream 308 at rising edges and falling edges of the clock signal 316, thus converting the first sub-stream 308 of digital samples $D_{P1}$ into a first sub-stream 318 of analog samples $A_{P1}=\{(A_0+A_1), (A_2+A_3), (A_4+A_5), (A_6+A_7), \ldots\}$. The second sub-DAC component 314 samples the second sub-stream 310 at rising edges and falling edges of the clock signal 316, thus converting the second sub-stream 310 of digital samples $D_{P2}$ into a second sub-stream 320 of analog samples $A_{P2}=\{(A_0-A_1), (-A_2+A_3), (A_4-A_5), (-A_6+A_7), \ldots\}$. The conversion of the processed sub-streams 308, 310 of digital samples to the respective sub-streams 318, 320 of analog samples is represented by the arrows 404. The clock signal $CLK_1$ 316 may alternate between amplitudes of +1 and −1, as illustrated in FIG. 4, or between some other values, such as 0 and +1. According to some examples, the clock signal $CLK_1$ 316 may have two levels, however other examples are contemplated wherein the clock signal $CLK_1$ 316 comprises three or more levels.

The sign modulation component 322 applies a sign modulation operation to the second sub-stream 320 of analog samples $A_{P2}$, thereby generating a sign-modulated sub-stream 326 of analog samples $A_{SM2}$. The sign modulation component 322 is controlled by a clock signal $CLK_2$ 324 which operates at the same frequency as the clock signal $CLK_1$ 316 (i.e., ~¼$F_S$). However, the clock signal $CLK_2$ 324 operates at a phase offset of three quarters of a period (i.e., 270° or 3π/2 or $3T_S$) relative to the clock signal $CLK_1$ 316. The clock signal $CLK_2$ 324 may be configured to have an inherent non-zero phase offset relative to the clock signal $CLK_1$ 316. Alternatively, the effect of the non-zero phase offset may be achieved by applying an appropriate time delay to the second sub-stream 320 of analog samples $A_{P2}$.

Different techniques are contemplated for implementing the sign modulation operations described throughout this document. According to some examples, sign modulation may be implemented using a multiplexing operation driven by a clock signal. According to other examples, where the clock signal is substantially square and alternates between positive and negative values, sign modulation may be achieved by multiplying a sub-stream of analog signals directly by the clock signal $CLK_2$ 324. For example, as illustrated in FIG. 4, the clock signal $CLK_2$ 324 is substantially square and alternates between amplitudes of +1 and −1. Each transition (i.e., from +1 to −1, or from −1 to +1) occurs at approximately the middle or center of a respective stable time interval of the second sub-stream 320 of analog samples $A_{P2}$. In this example, the sign-modulated sub-stream 326 of analog samples $A_{SM2}$ may be generated by multiplying the values of the second sub-stream 320 of analog samples $A_{P2}$ by the clock signal $CLK_2$ 324. For ease of explanation, the term "sign modulation" is used throughout this document and may refer to an operation that is capable of generating a sign inversion or sign transition of a signal to which the sign modulation is applied (e.g., from a positive amplitude to a negative amplitude, or from a negative amplitude to a positive amplitude). However, other examples are contemplated wherein the term "sign modulation" may be interpreted more broadly to encompass other types of clock-induced modulations. For example, while some implementations make use of a +1/−1 clock, other implementations may use a three-level clock (+1/0/−1) where the zero level may allow for time for sub-DACs to set up and stabilize before being activated to contribute to the output.

Table 1 is helpful for understanding the operation of the DAC 300 and the timing diagram illustrated in FIG. 4.

TABLE 1

| Time/Ts | [0,1) | [1,2) | [2,3) | [3,4) | [4,5) | [5,6) | [6,7) | [7,8) |
|---|---|---|---|---|---|---|---|---|
| $CLK_1$ 316 | +1 | | −1 | | +1 | | −1 | |
| sub-stream 318 | $A_0 + A_1$ | | $A_2 + A_3$ | | $A_4 + A_5$ | | $A_6 + A_7$ | |
| sub-stream 320 | $A_0 − A_1$ | | $−A_2 + A_3$ | | $A_4 − A_5$ | | $−A_6 + A_7$ | |
| $CLK_2$ 324 | +1 | −1 | | +1 | | −1 | | +1 |
| sign-modulated sub-stream 326 | $A_0 − A_1$ | $−A_0 + A_1$ | $A_2 − A_3$ | $−A_2 + A_3$ | $A_4 − A_5$ | $−A_4 + A_5$ | $A_6 − A_7$ | $−A_6 + A_7$ |
| output 304 | $A_0$ | $A_1$ | $A_2$ | $A_3$ | $A_4$ | $A_5$ | $A_6$ | $A_7$ |

The effect of applying the sign modulation operation 322 to the second sub-stream 320 will now be considered. Referring to the time interval [0, $T_S$), the second sub-stream 320 has a value of $(A_0−A_1)$ and the clock signal $CLK_2$ 324 has an amplitude of +1. Therefore, the sign-modulated sub-stream 326 is equal to the product of $(A_0−A_1)$ and (+1), such that the value of $A_{SM2}$ during the time interval [0, $T_S$) is $(A_0−A_1)$. Referring to the next time interval [$T_S$, $2T_S$), the second sub-stream 320 still has a value of $(A_0−A_1)$, but the clock signal $CLK_2$ 324 has transitioned to an amplitude of −1. Therefore, the sign-modulated sub-stream 326 is equal to the product of $(A_0−A_1)$ and (−1), such that the value of $A_{SM2}$ during the time interval [$T_S$, $2T_S$) is $(−A_0+A_1)$. Referring to the time interval [$2T_S$, $3T_S$), the second sub-stream 320 has transitioned to a value of $(−A_2+A_3)$, while the clock signal $CLK_2$ 324 still has the amplitude of −1. Therefore, the sign-modulated sub-stream 326 is equal to the product of $(−A_2+A_3)$ and (−1), such that the value of $A_{SM2}$ during the time interval [$2T_S$, $3T_S$) is $(A_2−A_3)$.

Referring again to the time interval [0, $T_S$), the first sub-stream 318 has a value of $(A_0+A_1)$. When this value is added to the value of the sign-modulated sub-stream 326 during the same time interval, the result is $(A_0+A_1)+(A_0−A_1)=2A_0$. During the next time interval [$T_S$, $2T_S$), the first sub-stream 318 still has a value of $(A_0+A_1)$. When this value is added to the value of the sign-modulated sub-stream 326 during the same time interval, the result is $(A_0+A_1)+(−A_0+A_1)=2A_1$. During the next time interval [$2T_S$, $3T_S$), the first sub-stream 318 has transitioned to a value of $(A_2+A_3)$. When this value is added to the value of the sign-modulated sub-stream 326 during the same time interval, the result is $(A_2+A_3)+(A_2−A_3)=2A_2$.

In general, it may be shown that the sum of the first sub-stream 318 of analog samples $A_{P1}$ and the sign-modulated sub-stream 326 of analog samples $A_{SM2}$ is equivalent to a stream of analog samples $\{2A_0, 2A_1, 2A_2, 2A_3, \ldots\}$ having a frequency $\sim F_S$. Therefore, by using the summation component 328 to add the sub-streams 318 and 326 together, while accounting for the factor of two, it is possible to generate the output stream 304 of analog samples $A=\{A_0, A_1, A_2, A_3, \ldots\}$. According to some examples, the factor of two is accounted for in the digital hardware pre-processing of the signals 308 and 310. In other words, the samples of the output stream 304 may be substantially determined from a sum of the sub-streams 318 and 326. The term "substantially determined" is used to reflect the fact that the samples of the output stream 304 may be dependent on other factors such as distortion and/or noise due to imperfect circuits and inter-symbol interference (ISI) caused by analog filtering, peaking, hysteresis, reconstruction filtering, and parasitic circuit elements. The generation of the output stream 304 from the sub-streams 318 and 326 is represented by the arrows 406.

It is notable that the output stream 304 of analog samples A has a frequency of ~$F_S$, even though each one of the clock signals $CLK_1$ 316 and $CLK_2$ 324 only has a frequency of ~¼ $F_S$. The combination of the pre-processing 306, the sign modulation 322, and the summation 328 provides for a DAC technique that uses clock signals with lower frequencies than the analog signal that is ultimately output by the DAC. Since each value in the digital sub-streams 308, 310 is equal to the sum of (or difference between) two samples D of the digital stream 302, the dynamic range of sub-streams 308, 310 is reduced by 50% relative to a standard DAC that relies on a clock signal of frequency $F_S$. Therefore, the reduction in clock frequency achievable with the DAC 300 may be balanced against signal quality requirements.

Figure 5:
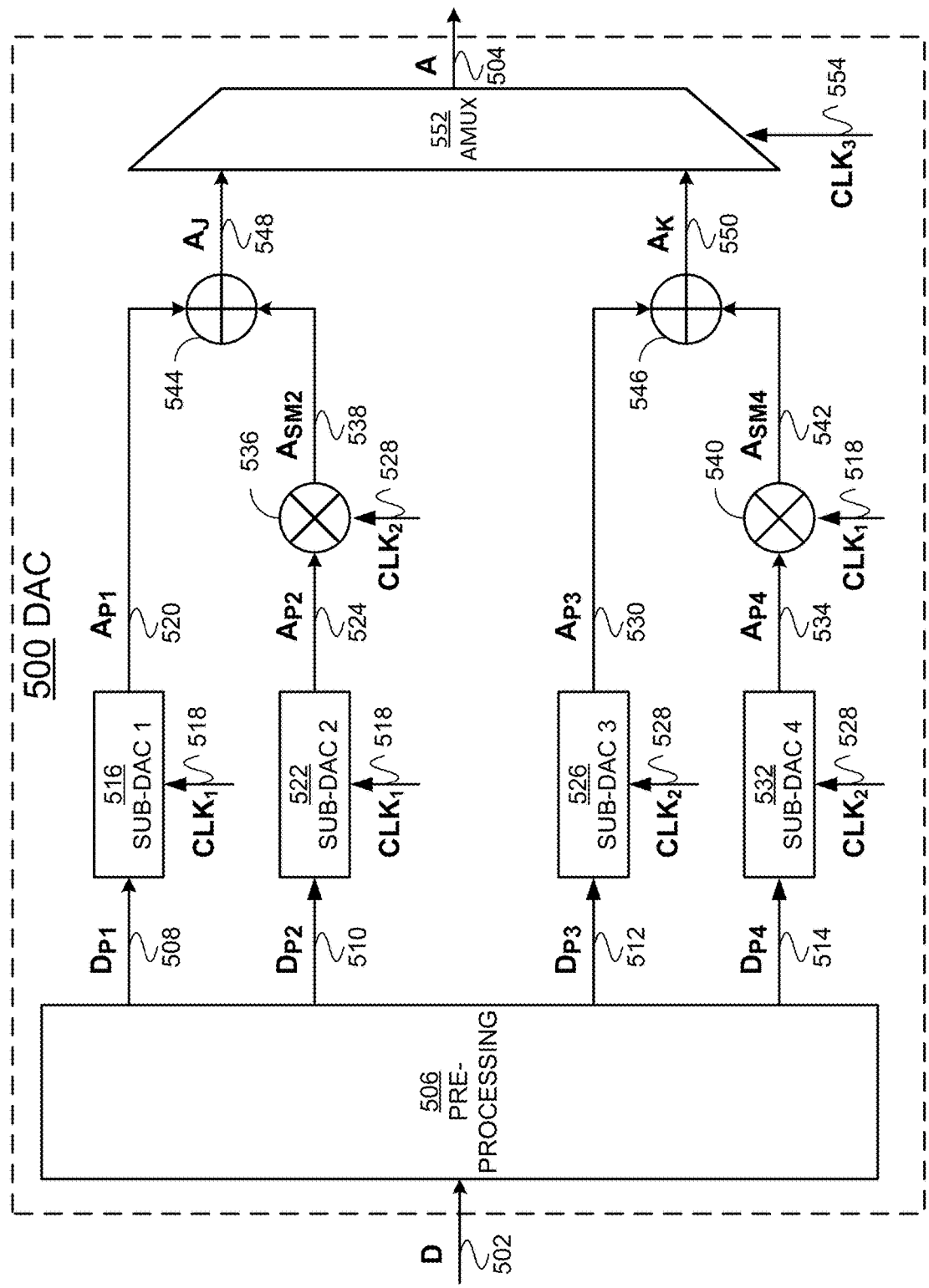
FIG. 5 illustrates a second DAC in accordance with some examples of the proposed technology.
Figure 6:
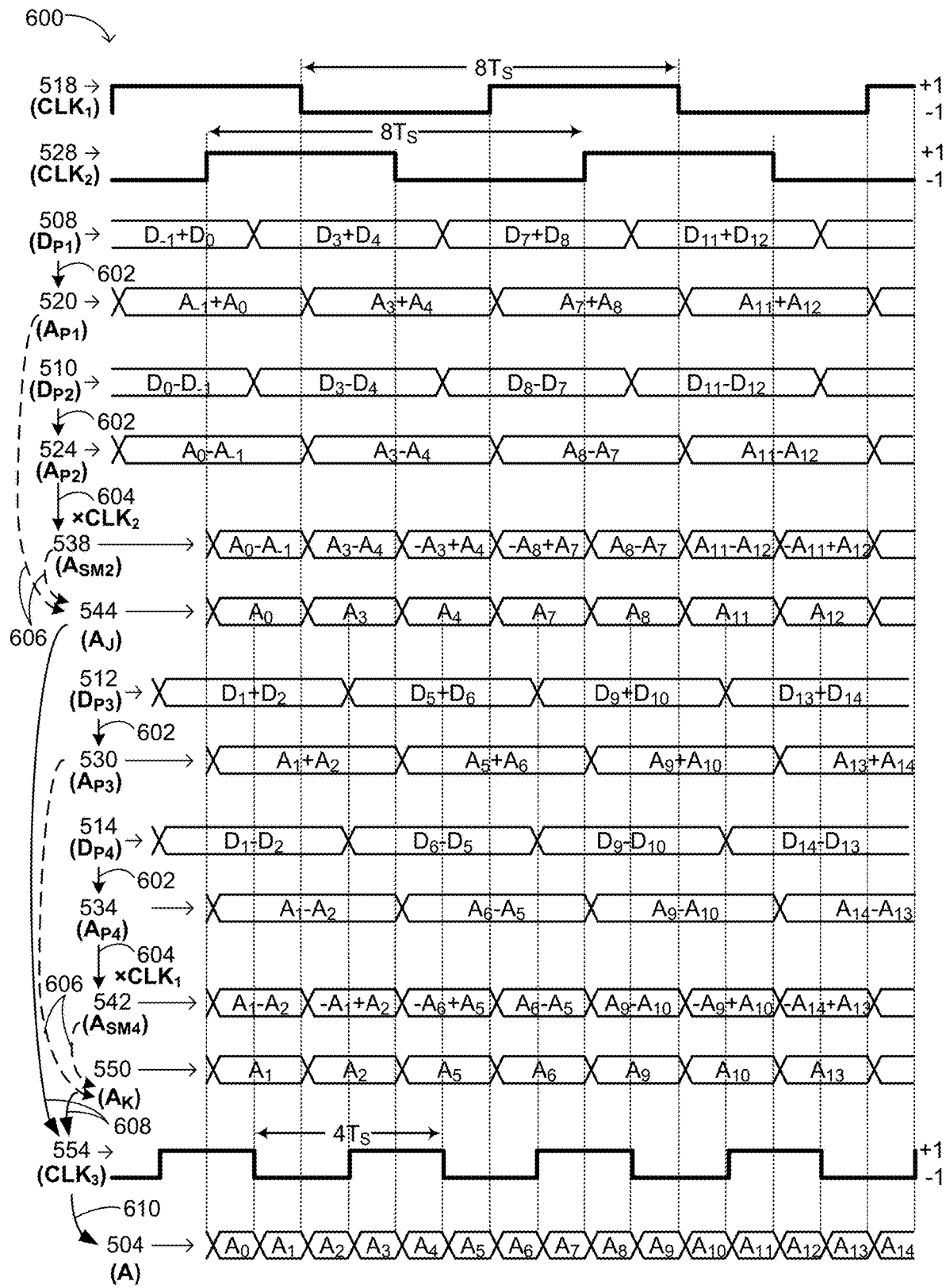
FIG. 6 is a timing diagram of clock signals and data signals in the second DAC of FIG. 5.

FIG. 5 illustrates an example DAC 500 that is operative to convert an input stream 502 of digital samples D into an output stream 504 of analog samples A at a sampling rate of F. FIG. 6 is a timing diagram of clock signals and data signals in the DAC 500.

The DAC 500 comprises a pre-processing module 506, a first sub-DAC component 516, a second sub-DAC component 522, a third sub-DAC component 526, a fourth sub-DAC component 532, two sign modulation components 536, 540, two summation components 544, 546, and an analog multiplexer (AMUX) component 552.

The pre-processing module 506 is operative to calculate, from selected terms of the input stream 502 of digital samples D, a first processed sub-stream 508 of digital samples $D_{P1}$, a second processed sub-stream 510 of digital samples $D_{P2}$, a third processed sub-stream 512 of digital samples $D_{P3}$, and a fourth processed sub-stream 514 of digital samples $D_{P4}$. In this example, each term of the first sub-stream 508 and the third sub-stream 512 is calculated from a sum of a different respective pair of adjacent digital samples of the input stream 502, while each term of the second sub-stream 510 and the fourth sub-stream 514 is calculated from a difference between a different respective pair of adjacent digital samples of the input stream 502. For clarity, the input stream 502 of digital samples D is not shown in the timing diagram of FIG. 6. However, given a stream of digital samples D={$D_{-1}$, $D_0$, $D_1$, $D_2$, $D_3$, $D_4$, . . . }, the first processed sub-stream 508 comprises the digital samples $D_{P1}$={($D_{-1}+D_0$), ($D_3+D_4$), ($D_7+D_8$), . . . }; the second processed sub-stream 510 comprises the digital samples $D_{P2}$={($D_0-D_{-1}$), ($D_3-D_4$), ($D_8-D_7$), . . . }; the third processed sub-stream 512 comprises the digital samples $D_{P3}$={($D_1+D_2$), ($D_5+D_6$), ($D_9+D_{10}$), . . . }; and the fourth processed sub-stream 514 comprises the digital samples $D_{P4}$={($D_1-D_2$), ($D_6-D_5$), ($D_9-D_{10}$), . . . }. Each term of D has a substantially stable time interval of ~$T_S$, while each term of $D_{P1}$, $D_{P2}$, $D_{P3}$, $D_{P4}$ has a substantially stable time interval of ~4$T_S$. Thus, each processed sub-stream 508, 510, 512, 514 has a frequency that is one quarter of the frequency of the input stream 502.

A clock signal $CLK_1$ 518 operating at ~¼$F_S$ (and therefore having a period of ~8$T_S$) is provided to each of the sub-DAC components 516, 522. The clock signal $CLK_1$ 518 may alternate between positive and negative amplitudes, such as +1 and −1, as illustrated in FIG. 6. The first sub-DAC component 516 samples the first sub-stream 508 at rising edges and falling edges of the clock signal $CLK_1$ 518, thus converting the first sub-stream 508 of digital samples $D_{P1}$ into a first sub-stream 520 of analog samples $A_{P1}$={($A_{-1}+A_0$), ($A_3+A_4$), ($A_7+A_8$), . . . } having a frequency of ~¼$F_S$. The second sub-DAC component 522 samples the second sub-stream 510 at rising edges and falling edges of the clock signal $CLK_1$ 518, thus converting the second sub-stream 510 of digital samples $D_{P2}$ into a second sub-stream 524 of analog samples $A_{P2}$={($A_0-A_1$), ($A_3-A_4$), ($A_8-A_7$), . . . } having a frequency of ~¼$F_S$.

A clock signal $CLK_2$ 528 is provided to each of the sub-DAC components 526, 532. As illustrated in FIG. 6, the clock signal $CLK_2$ 528 operates at the same frequency as the clock signal $CLK_1$ 518 (i.e., ~⅛$F_S$), but with a relative phase offset of one quarter of a period (90° or π/2 or 2$T_S$). As described with respect to the DAC 200, a non-zero phase offset may be inherent in a clock signal, or may be achieved by applying an appropriate time delay to the analog signal(s) to which the clock signal is being applied. The clock signal $CLK_2$ 528 may alternate between positive and negative amplitudes, such as +1 and −1. The third sub-DAC component 526 samples the third sub-stream 512 at rising edges and falling edges of the clock signal 528, thus converting the third sub-stream 512 of digital samples $D_{P3}$ into a third sub-stream 530 of analog samples $A_{P3}$={($A_1+A_2$), ($A_5+A_6$), ($A_9+A_{10}$), . . . } having a frequency of ~¼$F_S$. The fourth sub-DAC component 532 samples the fourth sub-stream 514 at rising edges and falling edges of the clock signal 528, thus converting the fourth sub-stream 514 of digital samples $D_{P4}$ into a fourth sub-stream 534 of analog samples $A_{P4}$={($A_1-A_2$), ($A_6-A_5$), ($A_9-A_{10}$), . . . } having a frequency of ~¼$F_S$.

The conversion of the processed sub-streams 508, 510, 512, 514 of digital samples to the respective sub-streams 520, 524, 530, 534 of analog samples is represented by the arrows 602.

The sign modulation component 536 applies a sign modulation operation to the second sub-stream 524 of analog samples $A_{P2}$, thereby generating a sign-modulated sub-stream 538 of analog samples $A_{SM2}$. The sign modulation component 536 is controlled by the clock signal $CLK_2$ 528. Where the clock signal $CLK_2$ 528 comprises a substantially square clock signal which alternates between positive and negative amplitudes, as illustrated in FIG. 6, the sign modulation operation performed by the component 536 may be implemented by multiplying the second sub-stream 524 by the clock signal $CLK_2$ 528. However, other techniques may be used to implement the sign modulation, as described previously. As illustrated in FIG. 6, each transition of the clock signal $CLK_2$ 528 (i.e., from +1 to −1, or from −1 to +1) occurs at approximately the middle or center of a respective stable time interval of the second sub-stream 524 of analog samples $A_{P2}$. As a result, the sign-modulated sub-stream 538 of analog samples $A_{SM2}$ has double the frequency of the second sub-stream 524 of analog samples $A_{P2}$, that is ~½$F_S$.

The sign modulation component 540 applies a sign modulation operation to the fourth sub-stream 534 of analog samples $A_{P4}$, thereby generating a sign-modulated sub-stream 542 of analog samples $A_{SM4}$. As illustrated in FIG. 6, each transition of the clock signal $CLK_1$ 518 (i.e., from +1 to −1, or from −1 to +1) occurs at approximately the middle or center of a respective stable time interval of the fourth sub-stream 534 of analog samples $A_{P4}$. As a result, the sign-modulated sub-stream 542 of analog samples $A_{SM4}$ has double the frequency of the fourth sub-stream 534 of analog samples $A_{P4}$, that is ~½$F_S$.

The generation of the sign-modulated sub-streams 538, 542 from the respective sub-streams 524, 534 is represented by the arrows 604.

As illustrated in FIG. 5, a summation operation 544 may be applied to the sub-streams 520 and 538 to generate a stream 548 of analog samples $A_J$. In parallel, another summation operation 546 may be applied to the sub-streams 530 and 542 to generate a stream 550 of analog samples $A_K$. The generation of the streams 548, 550 from the sub-streams 520, 538, 530, 542 is represented by the arrows 606. Each stream 548, 550 has a frequency of ~½$F_S$.

The streams 548, 550 may be provided to the AMUX component 552 which is controlled by the rising and falling edges of a clock signal $CLK_3$ 554 operating at ~¼$F_S$ (and therefore having a period of ~4$T_S$). According to some examples, the clock signal $CLK_3$ 554 may alternate between positive and negative amplitudes, such as +1 and −1. As illustrated in FIG. 6, each transition of the clock signal $CLK_3$ 554 (i.e., from +1 to −1, or from −1 to +1) occurs at approximately the middle or center of a respective stable time interval of the stream 548 of analog samples $A_J$ and the stream 550 of analog samples $A_K$. As a result, the stream 504 that is output by the AMUX component 552 has double the frequency of the input streams 548, 550, that is ~$F_S$. The AMUX component 552 is operative to output analog samples A that are alternatingly dependent on the analog samples $A_J$ of the stream 548 and the analog samples $A_K$ of the stream 550, as represented by the arrows 608 and 610.

Table 2 is helpful for understanding the operation of the DAC 500 and the timing diagram illustrated in FIG. 6.

TABLE 2

| Time/Ts | [0,1) | [1,2) | [2,3) | [3,4) | [4,5) | [5,6) | [6,7) | [7,8) |
| --- | --- | --- | --- | --- | --- | --- | --- | --- |
| $CLK_1$ 518 | +1 | | | | −1 | | | +1 |
| $CLK_2$ 528 | +1 | | | | | | −1 | |
| sub-stream 520 | $A_{-1} + A_0$ | | | | $A_3 + A_4$ | | | $A_7 + A_8$ |
| sub-stream 524 | $A_0 - A_{-1}$ | | | | $A_3 - A_4$ | | | $A_8 - A_7$ |
| sub-stream 530 | | $A_1 + A_2$ | | | | $A_5 + A_6$ | | |
| sub-stream 534 | | $A_1 - A_2$ | | | | $A_6 - A_5$ | | |
| sign-modulated sub-stream 538 | $A_0 + A_{-1}$ | | $A_3 - A_4$ | | $-A_3 + A_4$ | | $-A_8 + A_7$ | |
| sign-modulated sub-stream 542 | $A_1 - A_2$ | | $-A_1 + A_2$ | | $-A_6 + A_5$ | | $A_6 - A_5$ | |
| stream 548 | $A_0$ | | | | $A_3$ | | $A_4$ | $A_7$ |
| stream 550 | | $A_1$ | | | $A_2$ | | $A_5$ | $A_6$ |
| $CLK_3$ 554 | +1 | −1 | | +1 | | −1 | | +1 |
| output 504 | $A_0$ | $A_1$ | $A_2$ | $A_3$ | $A_4$ | $A_5$ | $A_6$ | $A_7$ |

Generation of the stream 548 of analog samples $A_J$ will be considered first. Referring to the time interval [0, 2$T_S$), the first sub-stream 520 of analog samples $A_{P1}$ has a value of ($A_{-1}+A_0$) and the second sub-stream 524 of analog samples $A_{P2}$ has a value of ($A_0-A_{-1}$). During this time interval, the clock signal $CLK_2$ 528 has an amplitude of +1, so it follows that the sign-modulated sub-stream 538 is equal to the product of ($A_0-A_{-1}$) and (+1), such that the value of $A_{SM2}$ during the time interval [0, 2$T_S$) is ($A_0-A_{-1}$). Referring to the time interval [2$T_S$, 4$T_S$), the first sub-stream 520 of analog samples $A_{P1}$ has transitioned to a value of ($A_3+A_4$) and the second sub-stream 524 of analog samples $A_{P2}$ has transitioned to a value of ($A_3-A_4$). During this time interval, the clock signal $CLK_2$ 528 still has to the amplitude of +1, so it follows that the sign-modulated sub-stream 538 is equal to the product of ($A_3-A_4$) and (+1), such that the value of $A_{SM2}$ during the time interval [2$T_S$, 4$T_S$) is ($A_3-A_4$). Referring to the time interval [4$T_S$, 6$T_S$), the first sub-stream 520 of analog samples $A_{P2}$ still has a value of ($A_3+A_4$) and the second sub-stream $A_{P2}$ still has the value of ($A_3-A_4$). However, during this time interval, the clock signal $CLK_2$ 528 has transitioned to an amplitude of −1, so it follows that the sign-modulated sub-stream 538 is equal to the product of ($A_3-A_4$) and (−1), such that the value of $A_{SM2}$ during the time interval [4$T_S$, 6$T_S$) is ($-A_3+A_4$). Referring to the time interval [6$T_S$, 8$T_S$), the first sub-stream 520 of analog samples $A_{P1}$ has transitioned to a value of ($A_7+A_8$) and the second sub-stream $A_{P2}$ has transitioned to value of ($A_8-A_7$). During this time interval, the clock signal $CLK_2$ 528 still has the amplitude of −1, so it follows that the sign-modulated sub-stream 538 is equal to the product of ($A_8-A_7$) and (−1), such that the value of $A_{SM2}$ during the time interval [6$T_S$, 8$T_S$) is ($-A_8+A_7$).

As illustrated in FIG. 5, the summation operation 544 generates the stream 548 of analog samples $A_J$ based on the sum of the first sub-stream 520 of analog samples $A_{P1}$ and the sign-modulated sub-stream 538 of analog samples $A_{SM2}$. When the respective values of $A_{P1}$ and $A_{SM2}$ are added together for the four time intervals [0, 2$T_S$), [2$T_S$, 4$T_S$), [4$T_S$, 6$T_S$), and [6$T_S$, 8$T_S$), the respective results are 2$A_0$, 2$A_3$, 2$A_4$, and 2$A_7$. Thus, when the factor of two is accounted for, the first four values of the stream 548 of analog samples $A_J$ are $A_0$, $A_3$, $A_4$, and $A_7$. As previously noted, the stream 548 has a frequency of ~½$F_S$.

Generation of the stream 550 of analog samples $A_K$ will now be considered. Referring to the time interval [0, 2$T_S$), the third sub-stream 530 of analog samples $A_{P3}$ has a value of ($A_1+A_2$) and the fourth sub-stream 534 of analog samples $A_{P4}$ has a value of ($A_1-A_2$). During this time interval, the clock signal $CLK_1$ 518 has an amplitude of +1, so it follows that the sign-modulated sub-stream 542 is equal to the product of ($A_1-A_2$) and (+1), such that the value of $A_{SM4}$ during the time interval [0, 2$T_S$) is ($A_1-A_2$). Referring to the time interval [2$T_S$, 4$T_S$), the third sub-stream 530 of analog samples $A_{P3}$ still has the value of ($A_1+A_2$) and the fourth sub-stream 534 of analog samples $A_{P4}$ still has the value of ($A_1-A_2$). However, during this time interval, the clock signal $CLK_1$ 518 has transitioned to an amplitude of −1, so it follows that the sign-modulated sub-stream 542 is equal to the product of ($A_1-A_2$) and (−1), such that the value of $A_{SM4}$ during the time interval [2$T_S$, 4$T_S$) is ($-A_1+A_2$). Referring to the time interval [4$T_S$, 6$T_S$), the third sub-stream 530 of analog samples $A_{P3}$ has transitioned to a value of ($A_5+A_6$) and the fourth sub-stream $A_{P4}$ has transitioned to a value of ($A_6-A_5$). During this time interval, the clock signal $CLK_1$ 518 still has the amplitude of −1, so it follows that the sign-modulated sub-stream 542 is equal to the product of ($A_6-A_5$) and (−1), such that the value of $A_{SM4}$ during the time interval [4$T_S$, 6$T_S$) is ($-A_6+A_5$). Referring to the time interval [6$T_S$, 8$T_S$), the third sub-stream 530 of analog samples $A_{P3}$ still has the value of ($A_5+A_6$) and the fourth sub-stream $A_{P4}$ still has the value of ($A_6-A_5$). However, during this time interval, the clock signal $CLK_1$ 518 has transitioned to the amplitude of +1, so it follows that the sign-modulated sub-stream 542 is equal to the product of ($A_6-A_5$) and (+1), such that the value of $A_{SM4}$ during the time interval [6$T_S$, 8$T_S$) is ($A_6-A_5$).

As illustrated in FIG. 5, the summation operation 546 generates the stream 550 of analog samples $A_K$ based on the sum of the third sub-stream 530 of analog samples $A_{P3}$ and the sign-modulated sub-stream 542 of analog samples $A_{SM4}$. When the respective values of $A_{P3}$ and $A_{SM4}$ are added together for the four time intervals [0, 2$T_S$), [2$T_S$, 4$T_S$), [4$T_S$, 6$T_S$), and [6$T_S$, 8$T_S$), the respective results are 2$A_1$, 2$A_2$, $2A_5$, and $2A_6$. Thus, when the factor of two is accounted for, the first four values of the stream 550 of analog samples $A_K$ are $A_1$, $A_2$, $A_5$, and $A_6$. As previously noted, the stream 550 has a frequency of $\sim\frac{1}{2}F_S$.

The streams 548, 550 are provided to the AMUX component 552 which is controlled by the clock signal $CLK_3$ 554. As previously noted, each transition of the clock signal $CLK_3$ 554 (i.e., from +1 to −1, or from −1 to +1) occurs at approximately the middle or center of a respective stable time interval of the streams 548, 550. In this example, the AMUX component 552 is operative to output the stream 548 when the clock signal $CLK_3$ 554 has a value of +1 and to output the stream 550 when the clock signal $CLK_3$ 554 has a value of −1. As provided in Table 2 and as illustrated in FIG. 6, during the time interval $[0, T_S)$, the clock signal $CLK_3$ 554 has a value of +1, so the AMUX component 552 outputs the current value of the stream 548 during that time interval, namely $A_0$. During the time interval $[T_S, 2T_S)$, the clock signal $CLK_3$ 554 has a value of −1, so the AMUX component 552 outputs the current value of the stream 550 during that time interval, namely $A_1$. During the time interval $[2T_S, 3T_S)$, the clock signal $CLK_3$ 554 still has the value of −1, so the AMUX component 552 outputs the current value of the stream 550 during that time interval, namely $A_2$. During the time interval $[3T_S, 4T_S)$, the clock signal $CLK_3$ 554 has the value of +1, so the AMUX component 552 outputs the current value of the stream 548 during that time interval, namely $A_3$. In this manner, the AMUX component 552 is configured to generate the stream 504 of analog samples $A=\{A_0, A_1, A_2, A_3, \ldots\}$.

Notably, the output stream 504 of analog samples A has a frequency of s, even though each one of the clock signals $CLK_1$ 518 and $CLK_2$ 528 only has a frequency of $\sim\frac{1}{8}F_S$, and the clock signal $CLK_3$ 554 only has a frequency of $\sim\frac{1}{4}F_S$. The combination of the pre-processing 506, the sign modulation operations 536, 540, the summation operations 544, 546, and the AMUX component 552 provides for a DAC technique that uses clock signals with lower frequencies than the analog signal that is ultimately output by the DAC. Since each value in the digital sub-streams 508, 510, 512, 514 is equal to the sum of (or difference between) two samples D of the digital stream 502, the dynamic range of sub-streams 508, 510, 512, 514 is reduced by 50% relative to a standard DAC that relies on a clock signal of frequency $F_S$. Therefore, the reduction in clock frequency achievable with the DAC 500 must be balanced against signal quality requirements.

Figure 7:
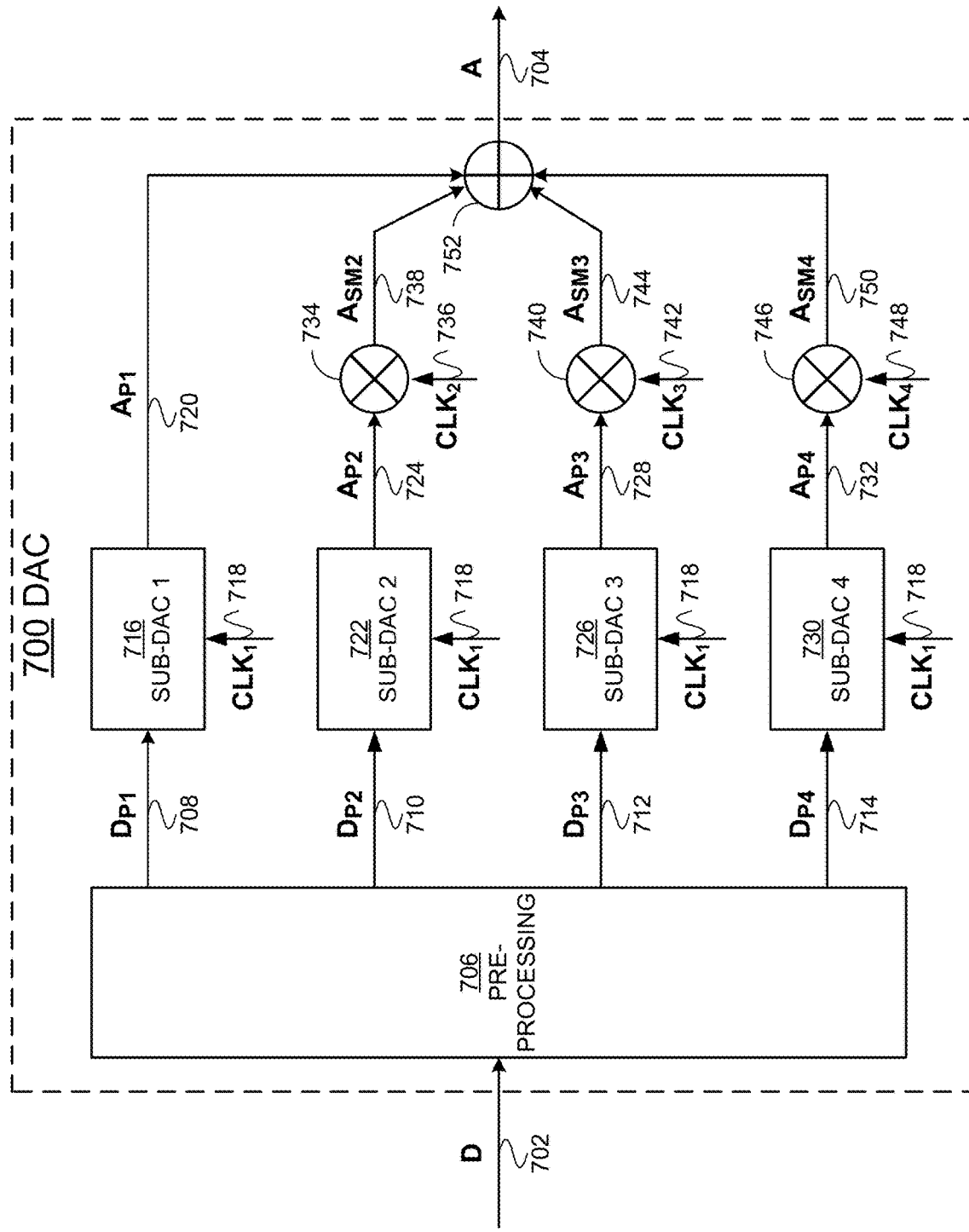
FIG. 7 illustrates a third DAC in accordance with some examples of the proposed technology.
Figure 8:
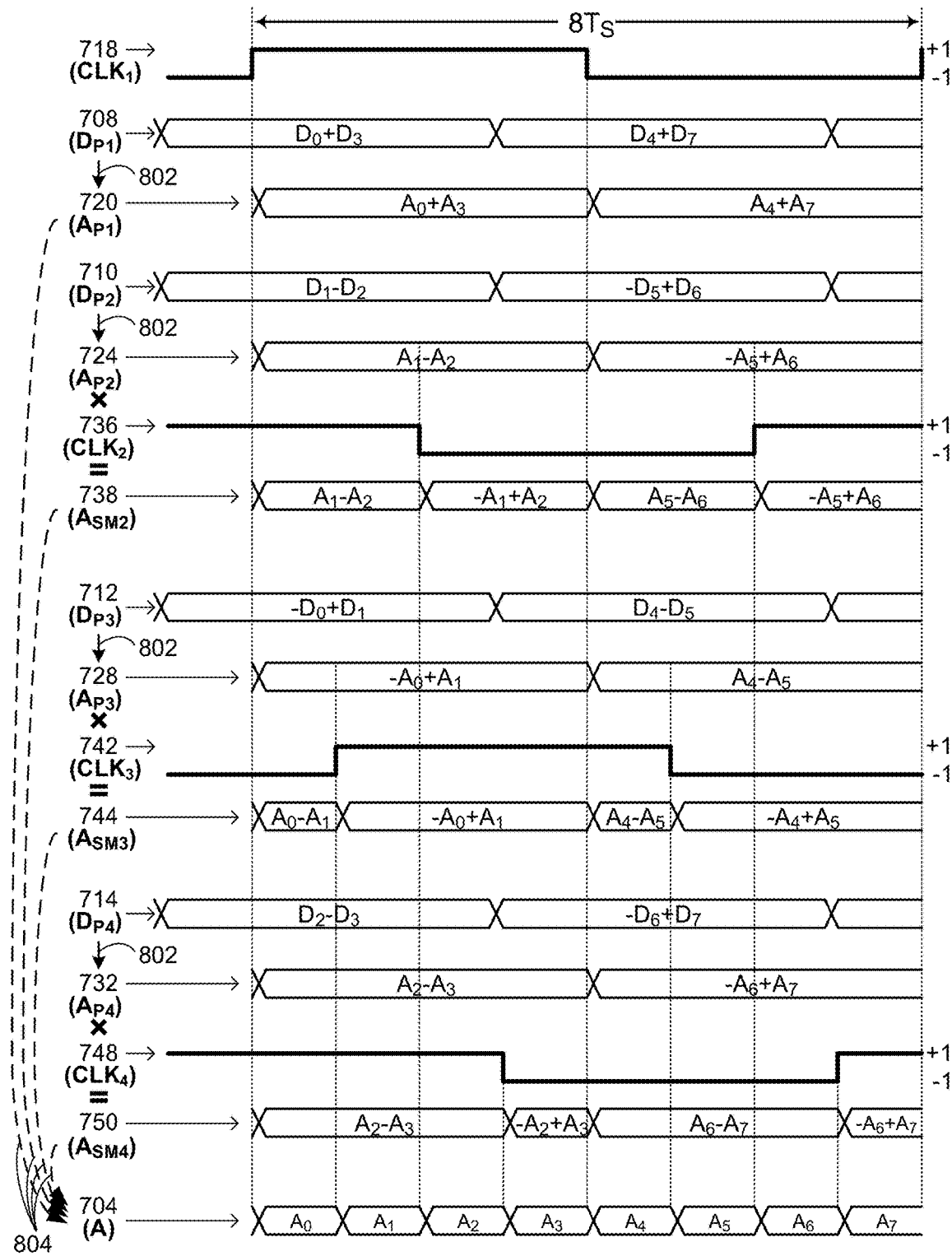
FIG. 8 is a timing diagram of clock signals and data signals in the third DAC of FIG. 7.

FIG. 7 illustrates an example DAC 700 that is operative to convert an input stream 702 of digital samples D into an output stream 704 of analog samples A at a sampling rate of $F_S$. FIG. 8 is a timing diagram of clock signals and data signals in the DAC 700.

The DAC 700 comprises a pre-processing module 706, a first sub-DAC component 716, a second sub-DAC component 722, a third sub-DAC component 726, a fourth sub-DAC component 732, three sign modulation components 734, 740, 746, and a summation component 752.

The pre-processing module 706 is operative to calculate, from selected terms of the input stream 702 of digital samples D, a first processed sub-stream 708 of digital samples $D_{P1}$, a second processed sub-stream 710 of digital samples $D_{P2}$, a third processed sub-stream 712 of digital samples $D_{P3}$, and a fourth processed sub-stream 714 of digital samples $D_{P4}$. In this example, each term of the first sub-stream 708 is calculated from a sum of a different respective pair of adjacent digital samples of the input stream 702, while each term of the second sub-stream 710, the third sub-stream 712, and the fourth sub-stream 714 is calculated from a difference between a different respective pair of adjacent digital samples of the input stream 702. Specifically, for an input stream 702 of digital samples $D=\{D_{-1}, D_0, D_1, D_2, D_3, D_4, \ldots\}$, the first processed sub-stream 708 comprises the digital samples $D_{P1}=\{(D_0+D_3), (D_4+D_7), (D_8+D_{11}), \ldots\}$; the second processed sub-stream 710 comprises the digital samples $D_{P2}=\{(D_1-D_2), (-D_5+D_6), (D_7-D_8), \ldots\}$; the third processed sub-stream 712 comprises the digital samples $D_{P3}=\{(-D_0+D_1), (D_4-D_5), (-D_8+D_9), \ldots\}$; and the fourth processed sub-stream 714 comprises the digital samples $D_{P4}=\{(D_2-D_3), (-D_6+D_7), (D_{10}-D_{11}), \ldots\}$. Each term of D has a substantially stable time interval of $\sim T_S$, while each term of $D_{P1}$, $D_{P2}$, $D_{P3}$, and $D_{P4}$ has a substantially stable time interval of $\sim 4T_S$. Thus, each processed sub-stream 708, 710, 712, 714 has a frequency that is one quarter of the frequency of the input stream 702.

A clock signal $CLK_1$ 718 operating at $\sim\frac{1}{8}F_S$ (and therefore having a period of $\sim 8T_S$) is provided to each of the sub-DAC components 716, 722, 726, 730. The clock signal $CLK_1$ 718 may alternate between positive and negative amplitudes, such as +1 and −1, as illustrated in FIG. 8. The first sub-DAC component 716 samples the first sub-stream 708 at rising edges and falling edges of the clock signal $CLK_1$ 718, thus converting the first sub-stream 708 of digital samples $D_{P1}$ into a first sub-stream 720 of analog samples $A_{P1}=\{(A_0+A_3), (A_4+A_7), (A_8+A_{11}), \ldots\}$. In a similar manner, the sub-DAC components 722, 726, 730 sample the respective sub-streams 710, 712, 714 of digital samples at rising edges and falling edges of the clock signal $CLK_1$ 718, thus resulting in respective sub-streams 724, 728, 732 of analog samples, namely $A_{P2}=\{(A_1-A_2), (-A_5+A_6), (A_7-A_8), \ldots\}$, $A_{P3}=\{(-A_0+A_1), (A_4-A_5), (-A_8+A_9), \ldots\}$, and $A_{P4}=\{(A_2-A_3), (-A_6+A_7), (A_{10}-A_{11}), \ldots\}$. The conversion of the processed sub-streams 708, 710, 712, 714 of digital samples to the respective sub-streams 720, 724, 728, 732 of analog samples is represented by the arrows 802. Each of the sub-streams 720, 724, 728, 732 has a frequency of $\sim\frac{1}{4}F_S$.

The sign modulation component 734 applies a sign modulation operation to the second sub-stream 724 of analog samples $A_{P2}$, thereby generating a sign-modulated sub-stream 738 of analog samples $A_{SM2}$. The sign modulation component 734 is controlled by a clock signal $CLK_2$ 736. As illustrated in FIG. 8, the clock signal $CLK_2$ 736 operates at the same frequency as the clock signal $CLK_1$ 718 (i.e., $\sim\frac{1}{8}F_S$), but with a relative phase offset of one quarter of a period (270° degrees or $3\pi/2$ or $6T_S$). The clock signal $CLK_2$ 736 may alternate between positive and negative amplitudes, such as +1 and −1. As illustrated in FIG. 8, each transition of the clock signal $CLK_2$ 736 (i.e., from +1 to −1, or from −1 to +1) occurs at approximately the middle or center of a respective stable time interval of the second sub-stream 724 of analog samples $A_{P2}$. As a result, the sign-modulated sub-stream 738 of analog samples $A_{SM2}$ has double the frequency of the second sub-stream 724 of analog samples $A_{P2}$, that is $\sim\frac{1}{2}F_S$.

The sign modulation component 740 applies a sign modulation operation to the third sub-stream 728 of analog samples $A_{P3}$, thereby generating a sign-modulated sub-stream 744 of analog samples $A_{SM3}$. The sign modulation component 740 is controlled by a clock signal $CLK_3$ 742. As illustrated in FIG. 8, the clock signal $CLK_3$ 742 operates at the same frequency as the clock signal $CLK_1$ 718 (i.e., $\sim\frac{1}{8}F_S$), but with a relative phase offset of one eighth of a period (45° or $\pi/4$ or $T_S$). The clock signal $CLK_3$ 742 may alternate between positive and negative amplitudes, such as +1 and −1. As illustrated in FIG. 8, the transitions of the clock signal $CLK_3$ 742 (i.e., from +1 to −1, or from −1 to +1) occur at regular positions within the stable time intervals of the third sub-stream 728 of analog samples $A_{P3}$. Specifically, in this example, each transition of the clock signal $CLK_3$ 742 occurs at approximately one quarter of the duration of a respective time interval of the third sub-stream 728.

The sign modulation component 746 applies a sign modulation operation to the fourth sub-stream 732 of analog samples $A_{P4}$, thereby generating a sign-modulated sub-stream 750 of analog samples $A_{SM4}$. The sign modulation component 746 is controlled by a clock signal $CLK_4$ 748. As illustrated in FIG. 8, the clock signal $CLK_4$ 748 operates at the same frequency as the clock signal $CLK_1$ 718 (i.e., $\sim\frac{1}{8}F_S$), but with a relative phase offset of seven eighths of a period (315° or 7π/4 or $7T_S$). The clock signal $CLK_4$ 748 may alternate between positive and negative amplitudes, such as +1 and −1. As illustrated in FIG. 8, the transitions of the clock signal $CLK_4$ 748 (i.e., from +1 to −1, or from −1 to +1) occur at regular positions within the stable time intervals of the fourth sub-stream 732 of analog samples $A_{P4}$. Specifically, in this example, each transition of the clock signal $CLK_4$ 748 occurs at approximately three quarters of the duration of a respective time interval of the fourth sub-stream 732.

Table 3 is helpful for understanding the operation of the DAC 700 and the timing diagram illustrated in FIG. 8.

TABLE 3

| Time/Ts | [0,1) | [1,2) | [2,3) | [3,4) | [4,5) | [5,6) | [6,7) | [7,8) |
|---|---|---|---|---|---|---|---|---|
| $CLK_1$ 718 | | +1 | | | | −1 | | |
| sub-stream 720 | | $A_0 + A_3$ | | | | $A_4 + A_7$ | | |
| sub-stream 724 | | $A_1 − A_2$ | | | | $−A_5 + A_6$ | | |
| $CLK_2$ 736 | +1 | | | −1 | | | | +1 |
| sign-modulated sub-stream 538 | $A_1 − A_2$ | | $−A_1 + A_2$ | | $A_5 − A_6$ | | $−A_5 + A_6$ | |
| sub-stream 728 | | $−A_0 + A_1$ | | | | $A_4 − A_5$ | | |
| $CLK_3$ 740 | −1 | | | +1 | | | | −1 |
| sign-modulated sub-stream 542 | $A_0 − A_1$ | | $−A_0 + A_1$ | | $A_4 − A_5$ | | $−A_4 + A_5$ | |
| sub-stream 732 | | $A_2 − A_3$ | | | | $−A_6 + A_7$ | | |
| $CLK_4$ 744 | +1 | | | −1 | | | | +1 |
| sign-modulated sub-stream 746 | $A_2 − A_3$ | | $−A_2 + A_3$ | | $A_6 − A_7$ | | $−A_6 + A_7$ | |
| output 704 | $A_0$ | $A_1$ | $A_2$ | $A_3$ | $A_4$ | $A_5$ | $A_6$ | $A_7$ |

Referring to the time interval [0, $T_S$), the first sub-stream 720 of analog samples $A_{P1}$ has a value of $(A_0+A_3)$, the second sub-stream 724 of analog samples $A_{P2}$ has a value of $(A_1−A_2)$, the third sub-stream 728 of analog samples $A_{P3}$ has a value of $(−A_0+A_1)$, and the fourth sub-stream 732 of analog samples $A_{P4}$ has a value of $(A_2−A_3)$. During this time interval, the clock signal $CLK_2$ 736 has an amplitude of +1, so it follows that the sign-modulated sub-stream 738 is equal to the product of $(A_1−A_2)$ and (+1), such that the value of $A_{SM2}$ during the time interval [0, $T_S$) is $(A_1−A_2)$. During this time interval, the clock signal $CLK_3$ 740 has an amplitude of −1, so it follows that the sign-modulated sub-stream 742 is equal to the product of $(−A_0+A_1)$ and (−1), such that the value of $A_{SM3}$ during the time interval [0, $T_S$) is $(A_0−A_1)$. During this time interval, the clock signal $CLK_4$ 744 has an amplitude of +1, so it follows that the sign-modulated sub-stream 746 is equal to the product of $(A_2−A_3)$ and (+1), such that the value of $A_{SM4}$ during the time interval [0, $T_S$) is $(A_2−A_3)$. Adding together the values of the sub-streams 720, 738, 744, 750 during the time interval [0, $T_S$) is equivalent to $(A_0+A_3)+(A_1−A_2)+(A_0−A_1)+(A_2−A_3)=2A_0$.

Referring to the time interval [$T_S$, $2T_S$), all of the sub-streams 720, 724, 728, 732 still have the same values as they did during the time interval [0, $T_S$). Furthermore, the clock signal $CLK_2$ 736 and the clock signal $CLK_4$ 744 still have the same amplitudes as they did during the time interval [0, $T_S$). Accordingly, the values of $A_{P1}$, $A_{SM2}$, and $A_{SM4}$ remain the same as they were during the previous time interval [0, $T_S$), namely, $(A_0+A_3)$, $(A_1−A_2)$, and $(A_2−A_3)$, respectively. However, the clock signal $CLK_3$ 740 has transitioned from the amplitude of −1 to an amplitude of +1. Accordingly, the sign-modulated sub-stream 742 is equal to the product of $(−A_0+A_1)$ and (+1), such that the value of $A_{SM3}$ during the time interval [$T_S$, $2T_S$) is $(−A_0+A_1)$. Therefore, when the values of the sub-streams 720, 738, 744, 750 during the time interval [$T_S$, $2T_S$) are added together, the result is equivalent to $(A_0+A_3)+(A_1−A_2)+(−A_0+A_1)+(A_2−A_3)=2A_1$.

This same exercise may be repeated for each time interval of duration $T_S$. In general, it may be shown that the sum of the sub-streams 720, 724, 728, 732 is equivalent to a stream of analog samples $\{2A_0, 2A_1, 2A_2, 2A_3, \ldots\}$ having a frequency $\sim F_S$. Therefore, by using the summation component 752 to add the sub-streams 720, 724, 728, 732 together, while accounting for the factor of two, it is possible to generate the output stream 704 of analog samples $A=\{A_0, A_1, A_2, A_3, \ldots\}$. The generation of the output stream 704 from the sub-streams 720, 738, 744, 750 is represented by the arrows 804.

As in the previous examples, it is notable that the output stream 704 of analog samples A has a frequency of $\sim F_S$, even though each one of the clock signals $CLK_1$ 718, $CLK_2$ 736, $CLK_3$ 742, and $CLK_4$ 748 only has a frequency of $\sim\frac{1}{8}F_S$. The combination of the pre-processing 706, the sign modulation operations 734, 740, 746, and the summation operation 752 provides for a DAC technique that uses clock signals with lower frequencies than the analog signal that is ultimately output by the DAC. Since each value in the digital sub-streams 708, 710, 712, 714 is equal to the sum of (or difference between) two samples D of the digital stream 702, the dynamic range of sub-streams 708, 710, 712, 714 is reduced by 50% relative to a standard DAC that relies on a clock signal of frequency F. Therefore, the reduction in clock frequency achievable with the DAC 700 must be balanced against signal quality requirements.

Figure 9:
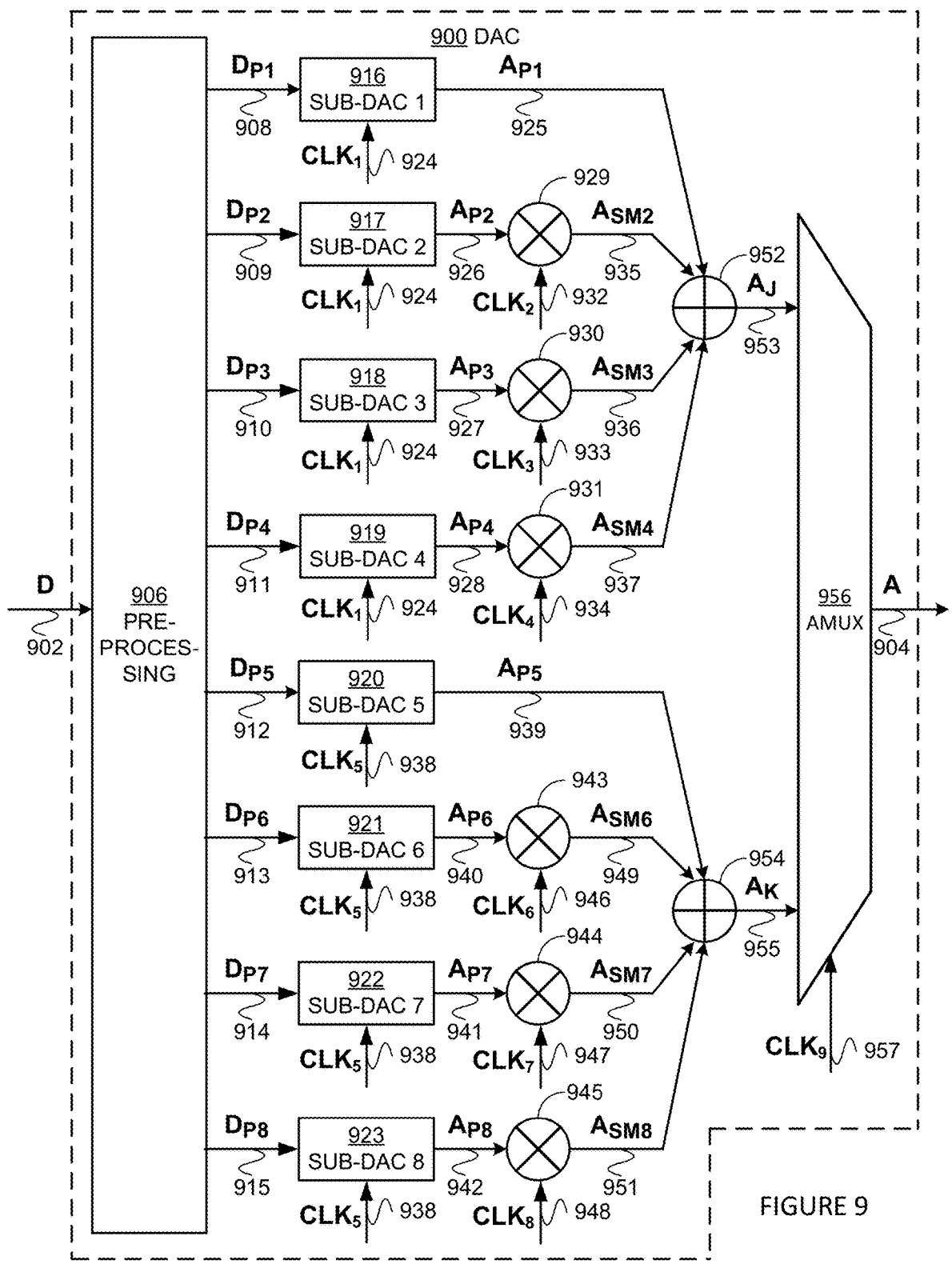
FIG. 9 illustrates a fourth DAC in accordance with some examples of the proposed technology.

FIG. 9 illustrates an example DAC 900 that is operative to convert an input stream 902 of digital samples D into an output stream 904 of analog samples A at a sampling rate of $F_S$.

The DAC 900 comprises a pre-processing module 906, eight sub-DAC components 916, 917, 918, 919, 920, 921, 922, 923, six sign modulation components 929, 930, 931, 943, 944, 945, two summation components 952, 954, and an AMUX component 956.

The pre-processing module 906 is operative to calculate, from selected terms of the input stream 902 of digital samples D, eight processed sub-streams 908, 909, 910, 911, 912, 913, 914, 915 of digital samples $D_{P1}$, $D_{P2}$, $D_{P3}$, $D_{P4}$, $D_{P5}$, $D_{P6}$, $D_{P7}$, $D_{P8}$, respectively. In this example, each term of the first sub-stream 908 and the fifth sub-stream 912 is calculated from a sum of a different respective pair of digital samples of the input stream 902, while each term of the remaining sub-streams 909, 910, 911 and 913, 914, 915 is calculated from a difference between a different respective pair of adjacent digital samples of the input stream 902. Specifically, for an input stream 902 of digital samples $D = \{D_{-1}, D_0, D_1, D_2, D_3, D_4, \ldots\}$, the first processed sub-stream 908 comprises the digital samples $D_{P1} = \{(D_2 + D_5), (D_{10} + D_{13}), \ldots\}$; the second processed sub-stream 909 comprises the digital samples $D_{P2} = \{(-D_2 + D_3), (D_{10} - D_{11}), \ldots\}$; the third processed sub-stream 910 comprises the digital samples $D_{P3} = \{(-D_3 + D_4), (D_{11} - D_{12}), \ldots\}$; the fourth processed sub-stream 911 comprises the digital samples $D_{P4} = \{(-D_4 + D_5), (D_{12} - D_{13}), \ldots\}$; the fifth processed sub-stream 912 comprises the digital samples $D_{P5} = \{(D_{-2} + D_0), (D_6 + D_9), \ldots\}$; the sixth processed sub-stream 913 comprises the digital samples $D_{P6} = \{D_{-2} - D_{-1}, (-D_7 + D_8), \ldots\}$; the seventh processed sub-stream 914 comprises the digital samples $D_{P7} = \{(D_{-1} - D_0), (-D_7 + D_8), \ldots\}$; and the eighth processed sub-stream 915 comprises the digital samples $D_{P8} = \{(D_0 - D_0), (-D_8 + D_9), \ldots\}$. Each term of D has a substantially stable time interval of $\sim T_S$, while each term of $D_{P1}$ to $D_{P8}$ has a substantially stable time interval of $\sim 8 T_S$. Thus, each processed sub-stream 908, 909, 910, 911, 912, 913, 914, 915 has a frequency that is one eighth of the frequency of the input stream 902.

A clock signal $CLK_1$ 924 operating at $\sim \frac{1}{16} F_S$ (and therefore having a period of $\sim 16 T_S$) is provided to each of the sub-DAC components 916, 917, 918, 919. The clock signal $CLK_1$ 924 may alternate between positive and negative amplitudes, such as +1 and −1. The first sub-DAC component 916 samples the first sub-stream 908 at rising edges and falling edges of the clock signal $CLK_1$ 924, thus converting the first sub-stream 908 of digital samples $D_{P1}$ into a first sub-stream 925 of analog samples $A_{P1} = \{(A_2 + A_5), (A_{10} \pm A_{13}), \ldots\}$. In a similar manner, the sub-DAC components 917, 918, 919 sample the respective sub-streams 909, 910, 911 of digital samples at rising edges and falling edges of the clock signal $CLK_1$ 924, thus resulting in respective sub-streams 926, 927, 928 of analog samples, namely $A_{P2} = \{(-A_2 + A_3), (A_{10} - A_{11}), \ldots\}$, $A_{P3} = \{(-A_3 + A_4), (A_{11} - A_{12}), \ldots\}$, and $A_{P4} = \{(-A_4 + A_5), (A_{12} - A_{13}), \ldots\}$. Each of the sub-streams 925, 926, 927, 928 has a frequency of $\sim \frac{1}{16} F_S$.

Another clock signal $CLK_5$ 938 is provided to each of the sub-DAC components 920, 921, 922, 923. The clock signal $CLK_5$ 938 operates at the same frequency as the clock signal $CLK_1$ 924 (i.e., $\sim \frac{1}{16} F_S$), but with a relative phase offset of one quarter of a period (i.e., 90° or $\pi/2$ or $4T_S$). The clock signal $CLK_5$ 938 may alternate between positive and negative amplitudes, such as +1 and −1. The fifth sub-DAC component 920 samples the fifth sub-stream 912 at rising edges and falling edges of the clock signal $CLK_5$ 938, thus converting the fifth sub-stream 912 of digital samples $D_{P5}$ into a fifth sub-stream 939 of analog samples $A_{P5} = \{(A_{-2} + A_1), (A_6 + A_9), \ldots\}$. In a similar manner, the sub-DAC components 921, 922, 923 sample the respective sub-streams 913, 914, 915 of digital samples at rising edges and falling edges of the clock signal $CLK_5$ 938, thus resulting in respective sub-streams 940, 941, 942 of analog samples, namely $A_{P6} = \{(A_{-2} - A_{-1}), (-A_7 + A_8), \ldots\}$, $A_{P7} = \{(A_{-1} - A_0), (-A_7 + A_8), \ldots\}$, and $A_{P8} = \{(A_0 - A_1), (-A_8 + A_9), \ldots\}$. Each of the sub-streams 939-942 has a frequency of $\sim \frac{1}{16} F_S$.

Table 4 is helpful for understanding the operation of the DAC 900.

TABLE 4

| Time/Ts | [0,1) | [1,2) | [2,3) | [3,4) | [4,5) | [5,6) | [6,7) | [7,8) | [8,9] | [9,10) |
|---|---|---|---|---|---|---|---|---|---|---|
| $CLK_1$ 924 | | | | +1 | | | | | −1 | |
| sub-stream 925 | | | | $A_2 + A_5$ | | | | | $A_{10} + A_{13}$ | |
| sub-stream 926 | | | | $-A_2 + A_3$ | | | | | $A_{10} - A_{11}$ | |
| $CLK_2$ 932 | | −1 | | | | +1 | | | | |
| sign-modulated sub-stream 935 | | $A_2 - A_3$ | | | | $-A_2 + A_3$ | | | $A_{10} - A_{11}$ | |
| sub-stream 927 | | | | $-A_3 + A_4$ | | | | | $A_{11} - A_{12}$ | |
| $CLK_3$ 933 | | −1 | | | | +1 | | | | |
| sign-modulated sub-stream 936 | | $A_3 - A_4$ | | | | $-A_3 + A_4$ | | | $A_{11} - A_{12}$ | |
| sub-stream 928 | | | | $-A_4 + A_5$ | | | | | $A_{12} - A_{13}$ | |
| $CLK_4$ 934 | | | −1 | | | | +1 | | | |
| sign-modulated sub-stream 937 | | | $A_4 - A_5$ | | | | $-A_4 + A_5$ | | $A_{12} - A_{13}$ | |
| stream 953 | | $A_2$ | | $A_3$ | $A_4$ | | $A_5$ | | $A_{10}$ | |
| $CLK_5$ 938 | | −1 | | | | +1 | | | | |
| sub-stream 939 | | $A_{-2} + A_1$ | | | | $A_6 + A_9$ | | | | |
| sub-stream 940 | | $A_{-2} + A_{-1}$ | | | | $-A_6 + A_7$ | | | | |
| $CLK_6$ 946 | | | −1 | | | | +1 | | | |
| sign-modulated sub-stream 949 | | $A_{-2} + A_{-1}$ | | | | $A_6 - A_7$ | | $-A_6 + A_7$ | | |
| sub-stream 941 | | $A_{-1} - A_0$ | | | | | $-A_7 + A_8$ | | | |
| $CLK_7$ 947 | | | | −1 | | | | +1 | | |
| sign-modulated sub-stream 950 | | $-A_{-1} + A_0$ | | | | $A_7 - A_8$ | | $-A_7 + A_8$ | | |
| sub-stream 942 | | $A_0 - A_1$ | | | | | $-A_8 + A_9$ | | | |
| $CLK_8$ 948 | +1 | | | −1 | | | | | | +1 |
| sign-modulated sub-stream 951 | $A_0 - A_1$ | $-A_0 + A_1$ | | | | $A_8 - A_9$ | | | | $-A_8 + A_9$ |
| stream 955 | $A_0$ | $A_1$ | | | | $A_6$ | $A_7$ | | $A_8$ | $A_9$ |
| $CLK_9$ 957 | −1 | | +1 | | | | | −1 | | |
| output 904 | $A_0$ | $A_1$ | $A_2$ | $A_3$ | $A_4$ | $A_5$ | $A_6$ | $A_7$ | $A_8$ | $A_9$ |

The sign modulation component 929 applies a sign modulation operation to the second sub-stream 926 of analog samples $A_{P2}$, thereby generating a sign-modulated sub-stream 935 of analog samples $A_{SM2}$. The sign modulation component 929 is controlled by a clock signal $CLK_2$ 932. The clock signal $CLK_2$ 932 operates at the same frequency as the clock signal $CLK_1$ 924 (i.e., $\sim\!1/16 F_S$), but with a relative phase offset of 3/16 of a period (i.e., 67.5° or $3\pi/8$ or $3T_S$). The transitions of the clock signal $CLK_2$ 932 (i.e., from +1 to −1, or from −1 to +1) occur at regular positions within the stable time intervals of the second sub-stream 926 of analog samples $A_{P2}$. Specifically, in this example, each transition of the clock signal $CLK_2$ 932 occurs at approximately three eighths of the duration of a respective time interval of the second sub-stream 926.

The sign modulation component 930 applies a sign modulation operation to the third sub-stream 927 of analog samples $A_{P3}$, thereby generating a sign-modulated sub-stream 936 of analog samples $A_{SM3}$. The sign modulation component 930 is controlled by a clock signal $CLK_3$ 933. The clock signal $CLK_3$ 933 operates at the same frequency as the clock signal $CLK_1$ 924 (i.e., $\sim\!1/16 F_S$), but with a relative phase offset of one quarter of a period (i.e., 90° or $\pi/2$ or $4T_S$). Each transition of the clock signal $CLK_3$ 933 (i.e., from +1 to −1, or from −1 to +1) occurs at approximately the middle or center of a respective stable time interval of the third sub-stream 927 of analog samples $A_{P3}$. As a result, the sign-modulated sub-stream 936 of analog samples $A_{SM3}$ has double the frequency of the third sub-stream 927 of analog samples $A_{P3}$, that is $\sim\!1/8 F_S$.

The sign modulation component 931 applies a sign modulation operation to the fourth sub-stream 928 of analog samples $A_{P4}$, thereby generating a sign-modulated sub-stream 937 of analog samples $A_{SM4}$. The sign modulation component 931 is controlled by a clock signal $CLK_4$ 934. The clock signal $CLK_4$ 934 operates at the same frequency as the clock signal $CLK_1$ 924 (i.e., $\sim\!1/16 F_S$), but with a relative phase offset of 5/16 of a period (i.e., 112.5° or $5\pi/8$ or $5T_S$). The transitions of the clock signal $CLK_4$ 934 (i.e., from +1 to −1, or from −1 to +1) occur at regular positions within the stable time intervals of the fourth sub-stream 928 of analog samples $A_{P4}$. Specifically, in this example, each transition of the clock signal $CLK_4$ 934 occurs at approximately five eighths of the duration of a respective time interval of the fourth sub-stream 928.

The sign modulation components 943, 944, 945 operate in a similar manner on the sub-streams 940, 941, 942, respectively, thereby generating the sign-modulated sub-streams 949, 950, 951. The sign modulation components 943, 944, 945 are controlled by clock signals 946, 947, 948, respectively. Each of the clock signals 946, 947, 948 operates at the same frequency as the clock signal $CLK_5$ 938 (i.e., $\sim\!1/16 F_S$), but with different respective phase shifts relative to the clock signal $CLK_5$ 938. Specifically, the clock signal $CLK_6$ 946 has a relative phase shift of $3\pi/8$, such that each transition of the clock signal $CLK_6$ 946 occurs at approximately three eighths of the duration of a respective time interval of the sixth sub-stream 940 of analog samples $A_{P6}$; the clock signal $CLK_7$ 947 has a relative phase shift of $\pi/2$, such that each transition of the clock signal $CLK_7$ 947 occurs at approximately the middle or center of a respective time interval of the seventh sub-stream 941 of analog samples $A_{P7}$; and the clock signal $CLK_8$ 948 has a relative phase shift of $5\pi/8$, such that each transition of the clock signal $CLK_8$ 948 occurs at approximately five eighths of the duration of a respective time interval of the eighth sub-stream 942 of analog samples $A_{P8}$.

As illustrated in FIG. 9, a summation operation 952 may be applied to the sub-streams 925, 935, 936, 937 to generate a stream 953 of analog samples $A_J$. In parallel, another summation operation 954 may be applied to the sub-streams 939, 949, 950, 951 to generate a stream 955 of analog samples $A_K$. The streams 953, 955 may be provided to the AMUX component 956 which is controlled by a clock signal $CLK_9$ 957 operating at $\sim\!1/8 F_S$. According to some examples, the clock signal $CLK_9$ 957 may alternate between positive and negative amplitudes, such as +1 and −1. The AMUX component 956 is operative to output analog samples A that are alternatingly dependent on the analog samples $A_J$ of the stream 953 and the analog samples $A_K$ of the stream 955.

In this example, the AMUX component 956 is operative to output the stream 953 when the clock signal $CLK_9$ 957 has a value of (+1) and to output the stream 955 when the clock signal $CLK_9$ 957 has a value of −1. As provided in Table 4, during the time interval [0, $T_S$), the clock signal $CLK_9$ 957 has a value of −1, so the AMUX component 956 outputs the current value of the stream 955 during that time interval. The stream 955 of analog samples $A_K$ is determined from the summation of the sub-stream 939 of analog samples $A_{P5}$, the sign-modulated sub-stream 949 of analog samples $A_{SM6}$, the sign-modulated sub-stream 950 of analog samples $A_{SM7}$, and the sign-modulated sub-stream 951 of analog samples $A_{SM8}$. According to Table 4, during the time interval [0, $T_S$), this summation is calculated as $(A_{-2}+A_1)+(-A_{-2}+A_{-1})+(-A_{-1}+A_0)+(A_0-A_1)=2A_0$. During the next time interval [$T_S$, $2T_S$), the clock signal $CLK_9$ 957 still has a value of −1, so the AMUX component 956 outputs the current value of the stream 955. According to Table 4, during the time interval [$T_S$, $2T_S$), the summation of $A_{P5}$, $A_{SM6}$, $A_{SM7}$, $A_{SM8}$ is calculated as $(A_{-2}+A_1)+(-A_{-2}+A_{-1})+(-A_{-1}+A_0)+(-A_0+A_1)=2A_1$. During the next time interval [$2T_S$, $3T_S$), the clock signal $CLK_9$ 957 transitions to a value of (+1), so the AMUX component 956 outputs the current value of the stream 953 during that time interval. The stream 953 of analog samples $A_J$ is determined by the summation of the sub-stream 925 of analog samples $A_{P1}$, the sign-modulated sub-stream 935 of analog samples $A_{SM2}$, the sign-modulated sub-stream 936 of analog samples $A_{SM3}$, and the sign-modulated sub-stream 937 of analog samples $A_{SM4}$. According to Table 4, during the time interval [$2T_S$, $3T_S$), this summation is calculated as $(A_2+A_5)+(A_2-A_3)+(A_3-A_4)+(A_4-A_5)=2A_2$. During the next time interval [$3T_S$, $4T_S$), the clock signal $CLK_9$ 957 still has a value of (+1), so the AMUX component 956 outputs the current value of the stream 953. According to Table 4, during the time interval [$3T_S$, $4T_S$), the summation of $A_{P2}$, $A_{SM2}$, $A_{SM3}$, $A_{SM4}$ is calculated as $(A_2+A_5)+(-A_2+A_3)+(A_3-A_4)+(A_4-A_5)=2A_3$. Thus, when the factor of two is accounted for, the AMUX component 956 is configured to generate the stream 904 of analog samples $A=\{A_0, A_1, A_2, A_3, \ldots\}$.

The output stream 904 of analog samples A has a frequency of $\sim\!F_S$, even though each one of the clock signals 924, 932, 933, 934, 938, 943, 944, 945 only has a frequency of $\sim\!1/16 F_S$, and the clock signal 957 only has a frequency of $\sim\!1/8 F_S$. The combination of the pre-processing 906, the sign modulation operations 929, 930, 931, 943, 944, 945, the summation operations 952, 954, and the AMUX component 956 provides for a DAC technique that uses clock signals with lower frequencies than the analog signal that is ultimately output by the DAC. Since each value in the digital sub-streams 908, 909, 910, 911, 912, 913, 914, 915 is equal to the sum of (or difference between) two samples D of the digital stream 902, the dynamic range of sub-streams 908, 909, 910, 911, 912, 913, 914, 915 is reduced by 50% relative to a standard DAC that relies on a clock signal of frequency $F_S$. Therefore, the reduction in clock frequency achievable with the DAC 900 must be balanced against signal quality requirements.

Figure 10:
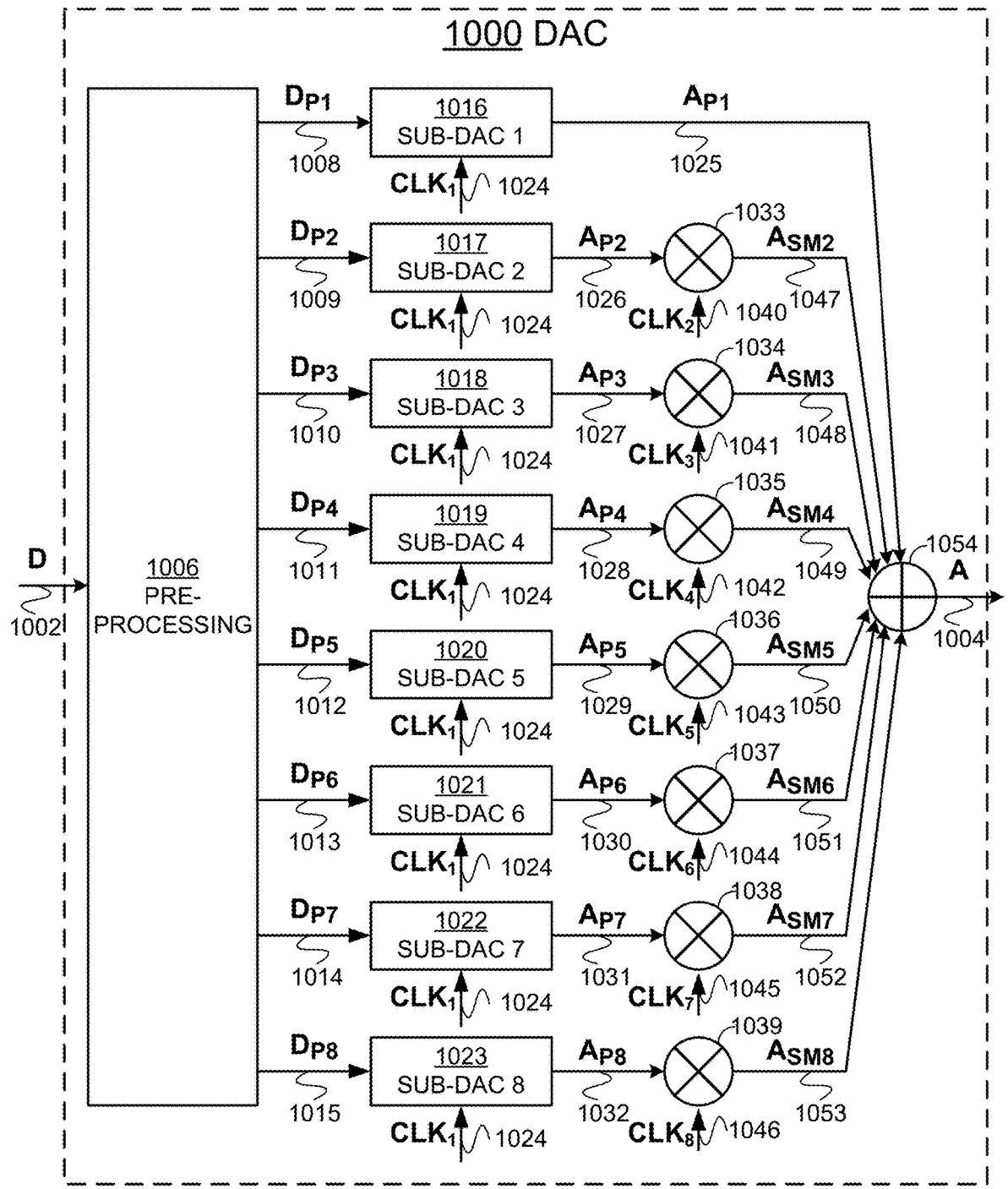
FIG. 10 illustrates a fifth DAC in accordance with some examples of the proposed technology.

FIG. 10 illustrates an example DAC 1000 that is operative to convert an input stream 1002 of digital samples D into an output stream 1004 of analog samples A at a sampling rate of $F_S$.

The DAC 1000 comprises a pre-processing module 1006, eight sub-DAC components 1016, 1017, 1018, 1019, 1020, 1021, 1022, 1023, seven sign modulation components 1033, 1034, 1035, 1036, 1037, 1038, 1039, and a summation component 1054.

The pre-processing module 1006 is operative to calculate, from selected terms of the input stream 1002 of digital samples D, eight processed sub-streams 1008, 1009, 1010, 1011, 1012, 1013, 1014, 1015 of digital samples $D_{P1}$, $D_{P2}$, $D_{P3}$, $D_{P4}$, $D_{P5}$, $D_{P6}$, $D_{P7}$, $D_{P8}$, respectively. In this example, each term of the first sub-stream 1008 is calculated from a sum of a different respective pair of digital samples of the input stream 802, while each term of the remaining sub-streams 1009, 1010, 1011, 1012, 1013, 1014, 1015 is calculated from a difference between a different respective pair of adjacent digital samples of the input stream 1002. Specifically, for an input stream 1002 of digital samples $D=\{D_0, D_1, D_2, D_3, D_4, \ldots\}$, the first processed sub-stream 1008 comprises the digital samples $D_{P1}=\{(D_0+D_7), (D_8+D_{15}), \ldots\}$; the second processed sub-stream 1009 comprises the digital samples $D_{P2}=\{(-D_0+D_1), (D_8-D_9), \ldots\}$; the third processed sub-stream 1010 comprises the digital samples $D_{P3}=\{(-D_1+D_2), (D_9-D_{10}), \ldots\}$; the fourth processed sub-stream 1011 comprises the digital samples $D_{P4}=\{(-D_2+D_3), (D_{10}-D_{11}), \ldots\}$; the fifth processed sub-stream 1012 comprises the digital samples $D_{P5}=\{(-D_3+D_4), (D_{11}-D_{12}), \ldots\}$; the sixth processed sub-stream 1013 comprises the digital samples $D_{P6}=\{(-D_4+D_5), (D_{12}-D_{13}), \ldots\}$; the seventh processed sub-stream 1014 comprises the digital samples $D_{P7}=\{(-D_5+D_6), (D_{13}-D_{14}), \ldots\}$; and the eighth processed sub-stream 1015 comprises the digital samples $D_{P8}=\{(-D_6+D_7), (D_{14}-D_{15}), \ldots\}$. Each term of D has a substantially stable time interval of $\sim T_S$, while each term of $D_{P1}$ to $D_{P8}$ has a substantially stable time interval of $\sim 8T_S$. Thus, each processed sub-stream 1008, 1009, 1010, 1011, 1012, 1013, 1014, 1015 has a frequency that is one eighth of the frequency of the input stream 1002.

A clock signal $CLK_1$ 1024 operating at $\sim \frac{1}{16}F_S$ (and therefore having a period of $\sim 16T_S$) is provided to each of the sub-DAC components 1016, 1017, 1018, 1019, 1020, 1021, 1022, 1023. The clock signal $CLK_1$ 1024 may alternate between positive and negative amplitudes, such as +1 and −1. The first sub-DAC component 1016 samples the first sub-stream 1008 at rising edges and falling edges of the clock signal $CLK_1$ 1024, thus converting the first sub-stream 1008 of digital samples $D_{P1}$ into a first sub-stream 1025 of analog samples $A_{P1}=\{(A_0+A_7), (A_8+A_{15}), \ldots\}$. In a similar manner, the sub-DAC components 1017, 1018, 1019, 1020, 1021, 1022, 1023 sample the respective sub-streams 1009, 1010, 1011, 1012, 1013, 1014, 1015 of digital samples at rising edges and falling edges of the clock signal $CLK_1$ 1024, thus resulting in respective sub-streams 1026, 1027, 1028, 1029, 1030, 1031, 1032 of analog samples, namely $A_{P2}=\{(-A_0+A_1), (A_8-A_9), \ldots\}$, $A_{P3}=\{(-A_1\pm A_2), (A_9-A_{10}), \ldots\}$, $A_{P4}=\{(-A_2+A_3), (A_{10}-A_{11}), \ldots\}$, $A_{P5}=\{(-A_3+A_4), (A_{11}-A_{12}), \ldots\}$, $A_{P6}=\{(-A_4+A_5), (A_{12}-A_{13}), \ldots\}$, $A_{P7}=\{(-A_5+A_6), (A_{13}-A_{14}), \ldots\}$, and $A_{P8}=\{(-A_6+A_7), (A_{14}-A_{15}), \ldots\}$. Each of the sub-streams 1025, 1026, 1027, 1028, 1029, 1030, 1031, 1032 has a frequency of $\sim \frac{1}{16}F_S$.

Table 5 is helpful for understanding the operation of the DAC 1000.

TABLE 5

| Time/Ts | [0,1) | [1,2) | [2,3) | [3,4) | [4,5) | [5,6) | [6,7) | [7,8) | [8,9) | [9,10) |
|---|---|---|---|---|---|---|---|---|---|---|
| $CLK_1$ 1024 | | | | | +1 | | | | −1 | |
| sub-stream 1025 | | | | | $A_0 + A_7$ | | | | $A_8 + A_{15}$ | |
| sub-stream 1026 | | | | | $-A_0 + A_1$ | | | | $A_8 - A_9$ | |
| $CLK_2$ 1040 | −1 | | | | | +1 | | | | −1 |
| sign-modulated sub-stream 1047 | $A_0 - A_1$ | | | | $-A_0 + A_1$ | | | | $A_8 - A_9$ | $-A_8 + A_9$ |
| sub-stream 1027 | | | | | $-A_1 + A_2$ | | | | $A_9 - A_{10}$ | |
| $CLK_3$ 1041 | −1 | | | | | +1 | | | | |
| sign-modulated sub-stream 1048 | $A_1 - A_2$ | | | | | $-A_1 + A_2$ | | | $A_9 - A_{10}$ | |
| sub-stream 1028 | | | | | $-A_2 + A_3$ | | | | $A_{10} - A_{11}$ | |
| $CLK_4$ 1042 | | −1 | | | | | +1 | | | |
| sign-modulated sub-stream 1049 | | $A_2 - A_3$ | | | | | $-A_2 + A_3$ | | $A_{10} - A_{11}$ | |
| sub-stream 1029 | | | | | | $-A_3 + A_4$ | | | $A_{11} - A_{12}$ | |
| $CLK_5$ 1043 | | −1 | | | | | +1 | | | |
| sign-modulated sub-stream 1050 | | $A_3 - A_4$ | | | | | $-A_3 + A_4$ | | $A_{11} - A_{12}$ | |
| sub-stream 1030 | | | | | | $-A_4 + A_5$ | | | $A_{12} - A_{13}$ | |
| $CLK_6$ 1044 | | | −1 | | | | | +1 | | |
| sign-modulated sub-stream 1051 | | | $A_4 - A_5$ | | | | | $-A_4 + A_5$ | $A_{12} - A_{13}$ | |
| sub-stream 1031 | | | | | | $-A_5 + A_6$ | | | $A_{13} - A_{14}$ | |
| $CLK_7$ 1045 | | | −1 | | | | | +1 | | |
| sign-modulated sub-stream 1052 | | | $A_5 - A_6$ | | | | | $-A_5 + A_6$ | $A_{13} - A_{14}$ | |
| sub-stream 1032 | | | | | $-A_6 + A_7$ | | | | $A_{14} - A_{15}$ | |
| $CLK_8$ 1046 | | | | −1 | | | | | +1 | |
| sign-modulated sub-stream 1053 | | | | $A_6 - A_7$ | | | | | $-A_6 + A_7$ | $A_{14} - A_{15}$ |
| output 1004 | $A_0$ | $A_1$ | $A_2$ | $A_3$ | $A_4$ | $A_5$ | $A_6$ | $A_7$ | $A_8$ | $A_9$ |

The sign modulation component 1033 applies a sign modulation operation to the second sub-stream 1026 of analog samples $A_{P2}$, thereby generating a sign-modulated sub-stream 1047 of analog samples $A_{SM2}$. The sign modulation component 1033 is controlled by a clock signal $CLK_2$ 1040. The clock signal $CLK_2$ 1040 operates at the same frequency as the clock signal $CLK_1$ 1024 (i.e., $\sim 1/16 F_S$), but with a relative phase shift of 1/16 of a period (i.e., 22.5° π/8 or $T_S$). The transitions of the clock signal $CLK_2$ 1040 (i.e., from +1 to −1, or from −1 to +1) occur at regular positions within the stable time intervals of the second sub-stream 1026 of analog samples $A_{P2}$. Specifically, in this example, each transition of the clock signal $CLK_2$ 1040 occurs at approximately one eighth of the duration of a respective time interval of the second sub-stream 1026.

The sign modulation components 1034, 1035, 1036, 1037, 1038, 1039 operate in a similar manner on the sub-streams 1027, 1028, 1029, 1030, 1031, 1032, respectively, thereby generating the sign-modulated sub-streams 1048, 1049, 1050, 1051, 1052, 1053. The sign modulation components 1034, 1035, 1036, 1037, 1038, 1039 are controlled by clock signals 1041, 1042, 1043, 1044, 1045, 1046, respectively. Each of the clock signals 1041, 1042, 1043, 1044, 1045, 1046 operates at the same frequency as the clock signal $CLK_1$ 1024 (i.e., $\sim 1/16 F_S$), but with different respective phase offsets relative to the clock signal $CLK_1$ 1024. Specifically, the clock signal $CLK_3$ 1041 has a relative phase offset of 1/8 of a period (i.e., 45° or π/8 or $2T_S$), such that each transition of the clock signal $CLK_3$ 1041 occurs at approximately one quarter of the duration of a respective time interval of the third sub-stream 1027 of analog samples $A_{P3}$; the clock signal $CLK_4$ 1042 has a positive phase offset of 3/16 of a period (i.e., 67.5° or 3π/8 or $3T_S$), such that each transition of the clock signal $CLK_4$ 1042 occurs at approximately three eighths of the duration of a respective time interval of the fourth sub-stream 1028 of analog samples $A_{P4}$; the clock signal $CLK_5$ 1043 has a relative phase offset of one quarter of a period (i.e., 90° or π/4 or $4T_S$), such that each transition of the clock signal $CLK_5$ 1043 occurs at approximately the middle or center of the duration of a respective time interval of the fifth sub-stream 1029 of analog samples $A_{P5}$; the clock signal $CLK_6$ 1044 has a relative phase offset of 5/16 of a period (i.e., 112.5° or 5π/8 or $5T_S$), such that each transition of the clock signal $CLK_6$ 1044 occurs at approximately five eighths of the duration of a respective time interval of the sixth sub-stream 1030 of analog samples $A_{P6}$; the clock signal $CLK_7$ 1045 has a relative phase offset of 3/8 of a period (i.e., 135° or 3π/4 or $6T_S$), such that each transition of the clock signal $CLK_7$ 1045 occurs at approximately three quarters of the duration of a respective time interval of the seventh sub-stream 1031 of analog samples $A_{P7}$; and the clock signal $CLK_8$ 1046 has a relative phase offset of 7/16 of a period (i.e., 157.5° or 7π/8 or $7T_S$), such that each transition of the clock signal $CLK_8$ 1046 occurs at approximately seven eighths of the duration of a respective time interval of the eighth sub-stream 1032 of analog samples $A_{P8}$.

In general, it may be shown that a summation of the sub-stream 1025 and the sign-modulated sub-streams 1047, 1048, 1049, 1050, 1052, 1053 results in a stream of analog samples $\{2A_0, 2A_1, 2A_2, 2A_3, \ldots\}$ having a frequency $\sim F_S$. Therefore, by using the summation component 1054 to add the sub-streams 1025, 1047, 1048, 1049, 1050, 1051, 1052, 1053 together, while accounting for the factor of two, it is possible to generate the output stream 1004 of analog samples $A = \{A_0, A_1, A_2, A_3, \ldots\}$.

Figure 11:
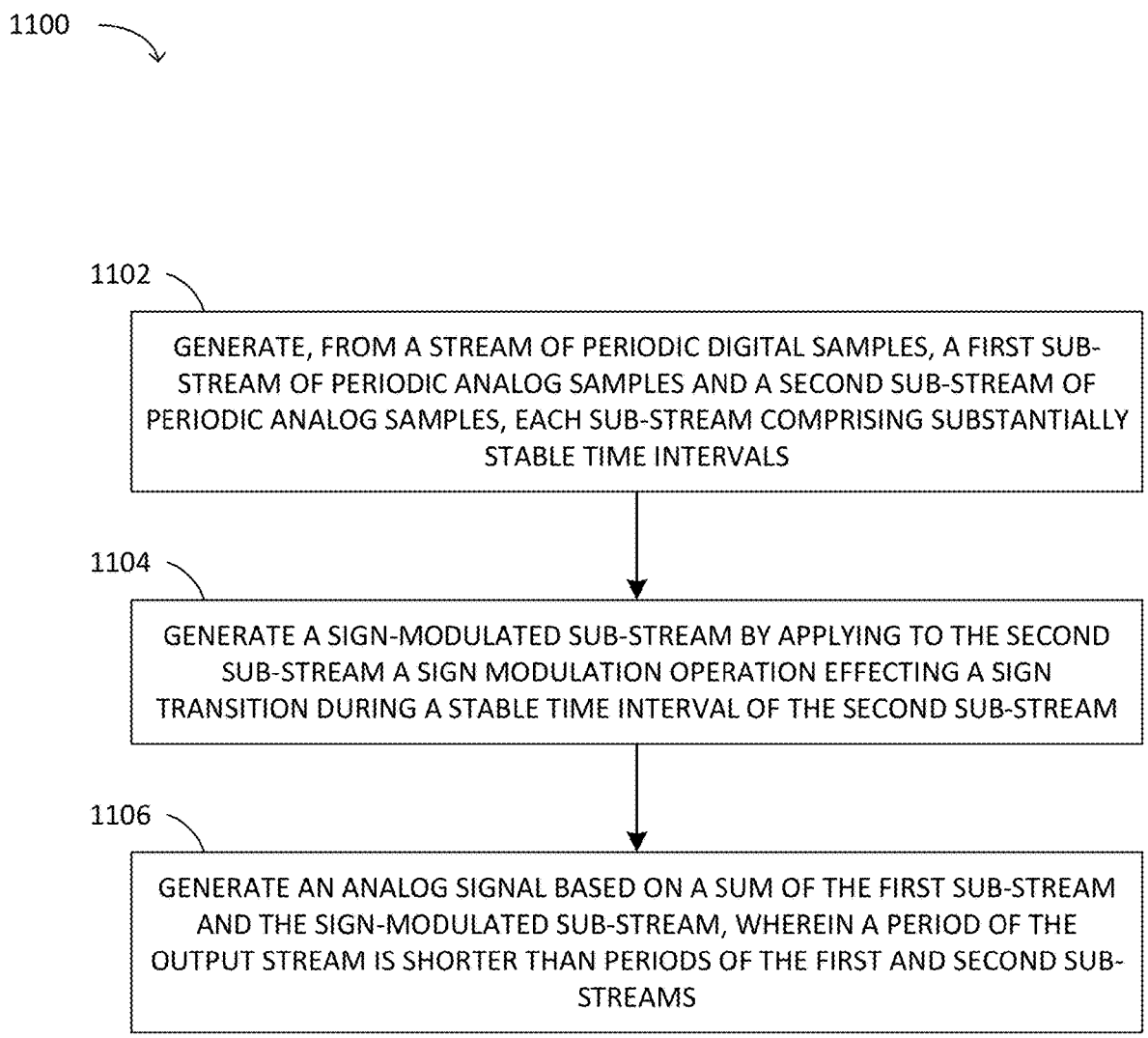
FIG. 11 illustrates an example method for digital-to-analog conversion using sign modulation.

FIG. 11 illustrates an example method 1100 for digital-to-analog conversion using sign modulation. The method 1100 may be performed at an electronic apparatus, such as the transmitter 100. For example, aspects of the method 1100 may be implemented within any of the DACs 130, 131, 138, 139.

At 1102, a first sub-stream of periodic analog samples and a second sub-stream of periodic analog samples are generated from a stream of periodic digital samples. Each sub-stream comprises substantially stable time intervals. The term "periodic" is used to denote the uniform spacing of the samples in time. In other words, a stream (or sub-stream) of periodic analog (or digital) samples comprises samples that are uniformly spaced in time, such that the stream (or sub-stream) may be characterized by a period (or frequency).

According to some examples, each sample of the first sub-stream may be generated from a sum of two of the digital samples, which may be adjacent or non-adjacent. According to some examples, each sample of the second sub-stream may be generated from a difference between two of the digital samples, which may be adjacent or non-adjacent.

In one example, the stream of periodic digital samples comprises the stream 302 of digital samples D, the first sub-stream of periodic analog samples comprises the sub-stream 318 of analog samples $A_{P1}$, and the second sub-stream of periodic analog samples comprises the sub-stream 320 of analog samples $A_{P2}$. In this example, the generation at 1102 comprises applying the pre-processing 306 to the stream 302 to generate the sub-streams 308, 310, respectively, followed by the sampling of the sub-streams 308, 310 using the sub-DACs 312, 314, respectively.

In another example, the stream of periodic digital samples comprises the stream 502 of digital samples D, the first sub-stream of periodic analog samples comprises the sub-stream 520 of analog samples $A_{P1}$, and the second sub-stream of periodic analog samples comprises the sub-stream 524 of analog samples $A_{P2}$. Alternatively, where the stream of periodic digital samples comprises the stream 502 of digital samples D, the first sub-stream of periodic analog samples may comprise the sub-stream 530 of analog samples $A_{P3}$, and the second sub-stream of periodic analog samples may comprise the sub-stream 534 of analog samples $A_{P4}$. In these alternative examples, the generation at 1102 comprises applying the pre-processing 506 to the stream 502 to generate the sub-streams 508, 510 (or 512, 514), followed by the sampling of the sub-streams 508, 510 (or 512, 514) using the respective sub-DACs (i.e., either 516, 522 or 526, 532).

In yet another example, the stream of periodic digital samples comprises the stream 702 of digital samples D, the first sub-stream of periodic analog samples comprises the sub-stream 720 of analog samples $A_{P2}$, and the second sub-stream of periodic analog samples comprises the sub-stream 724 of analog samples $A_{P2}$, or the sub-stream 728 of analog samples $A_{P3}$, or the sub-stream 732 of analog samples $A_{P4}$. In this example, the generation at 1102 comprises applying the pre-processing 706 to the stream 702 to generate the sub-stream 708 and the sub-stream 710 (or 712 or 714), followed by the sampling of the sub-streams using the respective sub-DACs for those sub-streams.

In a further example, the stream of periodic digital samples comprises the stream 902 of digital samples D, the first sub-stream of periodic analog samples comprises the sub-stream 925 of analog samples $A_{P1}$, and the second sub-stream of periodic analog samples comprises the sub-stream 926 of analog samples $A_{P2}$, or the sub-stream 927 of analog samples $A_{P3}$, or the sub-stream 928 of analog samples $A_{P4}$. Alternatively, where the stream of periodic digital samples comprises the stream 902 of digital samples D, the first sub-stream of periodic analog samples may comprise the sub-stream 939 of analog samples $A_{P5}$, and the second sub-stream of periodic analog samples may comprise the sub-stream 940 of analog samples $A_{P6}$, or the sub-stream 941 of analog samples $A_{P7}$, or the sub-stream 942 of analog samples $A_{P8}$. In these alternative examples, the generation at 1102 comprises applying the pre-processing 906 to the stream 902 to generate the two sub-streams (e.g., sub-streams 908, 909), followed by the sampling of the sub-streams using the respective sub-DACs for those sub-streams.

In yet a further example, the stream of periodic digital samples comprises the stream 1002 of digital samples D, the first sub-stream of periodic analog samples comprises the sub-stream 1025 of analog samples $A_{P1}$, and the second sub-stream of periodic analog samples comprises any one of the sub-streams 1026, 1027, 1028, 1029, 1030, 1031, 1032 of analog samples $A_{P2}$-$A_{P8}$, respectively. In this example, the generation at 1202 comprises applying the pre-processing 1006 to the stream 1002 to generate the sub-stream 1008 and any one of the sub-streams 1009, 1010, 1011, 1012, 1013, 1014, 1015, followed by the sampling of the sub-streams using the sub-DAC 1016 and any one of the sub-DACs 1017, 1018, 1019, 1020, 1021, 1022, 1023, respectively.

According to each of these examples, the periods of the first and second sub-streams generated at 1102 are equal (i.e., ~2$T_S$ for DAC 300; ~4$T_S$ for DACs 500 and 700; ~8$T_S$ for DACs 900 and 1000). However, other examples are contemplated wherein the period of the first sub-stream may differ from the period of the second sub-stream.

At 1104, a sign-modulated sub-stream is generated by applying to the second sub-stream of periodic analog samples a sign modulation operation that effects or generates or causes or results in a sign transition during a stable time interval of the second sub-stream. As described previously, the sign modulation operation may comprise, for example, a multiplexing operation driven by a clock signal, or multiplication by a substantially square clock signal. Again, the term sign transition is used for clarity and in reference to a potentially advantageous implementation employing a +1/−1 clock. However, other clocks may be used to induce some other form of distinct transition.

In the example where the second sub-stream comprises the sub-stream 320, the sign-modulation operation comprises the operation 322 that results in the sign-modulated sub-stream 326 of analog samples $A_{SM2}$. In the example where the second sub-stream comprises the sub-stream 524 (or 534), the sign-modulation operation comprises the operation 536 (or 540) that results in the sign-modulated sub-stream 538 (or 542). In the example where the second sub-stream comprises the sub-stream 724 (or 728 or 732), the sign-modulation operation comprises the operation 734 (or 740 or 746) that results in the sign-modulated sub-stream 738 (or 744 or 750). In the example where the second sub-stream comprises one of the sub-streams 926, 927, 928, 940, 941, 942, the sign-modulation operation comprises a respective one of the operations 929, 930, 931, 943, 944, 945 that results in a respective one of the sign-modulated sub-streams 935, 936, 937, 949, 950, 951. In the example where the second sub-stream comprises one of the sub-streams 1026, 1027, 1028, 1029, 1030, 1031, 1032, the sign-modulation operation comprises a respective one of the operations 1033, 1034, 1035, 1036, 1037, 1038, 1039 that results in a respective one of the sign-modulated sub-streams 1047, 1048, 1049, 1050, 1051, 1052, 1053.

As illustrated in the timing diagrams 400, 600, 800 and in Tables 1 through 5, the sign modulation operation applied at 1104 may effect (or generate or cause or result in) a plurality of sign transitions during a plurality of stable time intervals of the second sub-stream.

In some examples, each sign transition may occur at approximately the middle of a respective stable time interval. For example, the sign modulation operation 322 as controlled by the clock signal $CLK_2$ 324 causes a sign transition to occur at approximately the middle or center of each period of the sub-stream 320, such that the resulting sign-modulated sub-stream 326 has one half the period of the sub-stream 320 (or twice the frequency), as shown in the timing diagram 400 and in Table 1. In another example, the sign modulation operation 536 as controlled by the clock signal $CLK_2$ 528 causes a sign transition to occur at approximately the middle or center of each period of the sub-stream 524, such that the resulting sign-modulated sub-stream 538 has one half the period of the sub-stream 524 (or twice the frequency), as shown in the timing diagram 600 and in Table 2. In yet another example, the sign modulation operation 734 as controlled by the clock signal $CLK_2$ 736 causes a sign transition to occur at approximately the middle or center of each period of the sub-stream 724, such that the resulting sign-modulated sub-stream 738 has one half the period of the sub-stream 724 (or twice the frequency), as shown in the timing diagram 800 and in Table 3. Referring to Tables 4 and 5, it is apparent that the sign modulation operations 930, 944, and 1036 also cause sign transitions at approximately the middle of each period of the respective sub-streams to which they are applied.

In other examples, the sign modulation operations may cause sign transitions to occur at regular offset times within the plurality of stable time intervals. For example, as shown in the timing diagram 800 and in Table 3, the sign modulation operation 740 as controlled by the clock signal $CLK_3$ 724 causes a sign transition to occur within each stable time interval of the sub-stream 728 at a regular or consistent offset time of approximately $T_S$ relative to the beginning of the interval, while the sign modulation operation 746 as controlled by the clock signal $CLK_4$ 748 causes a sign transition to occur within each stable time interval of the sub-stream 732 at a regular or consistent offset time of approximately 3$T_S$ relative to the beginning of the interval. In another example, as shown in Table 4, the sign modulation operation 929 as controlled by the clock signal $CLK_2$ 932 causes a sign transition to occur within each stable time interval of the sub-stream 926 at a regular offset time of approximately 3$T_S$ relative to the beginning of the interval; the sign modulation operation 931 as controlled by the clock signal $CLK_4$ 934 causes a sign transition to occur within each stable time interval of the sub-stream 928 at a regular or consistent offset time of approximately 5$T_S$ relative to the beginning of the interval; the sign modulation operation 943 as controlled by the clock signal $CLK_6$ 946 causes a sign transition to occur within each stable time interval of the sub-stream 940 at a regular or consistent offset time of approximately 3$T_S$ relative to the beginning of the interval; and the sign modulation operation 945 as controlled by the clock signal $CLK_8$ 948 causes a sign transition to occur within each stable time interval of the sub-stream 942 at a regular offset time of approximately 5$T_S$ relative to the beginning of the interval. In yet another example, referring to Table 5, it is apparent that the sign modulation operations 1033, 1034, 1035, 1036, 1037, 1038, 1039 cause sign transitions to occur at regular offset times of approximately $T_S$, $2T_S$, $3T_S$, $4T_S$, $5T_S$, $6T_S$, $7T_S$, respectively, relative to the beginning of each stable time interval of the respective sub-streams to which the operations are applied. In the case of the sign modulation operation 1036, the offset time of $4T_S$, coincides with the center of the time interval.

At 1106, an output stream of periodic analog samples is generated based on a sum of the first sub-stream and the sign-modulated sub-stream, wherein a period of the output stream is shorter than periods of the first and second sub-streams. For example, the stream 304 of analog samples A is generated based on a sum of the sub-stream 318 of analog samples $A_{P1}$ and the sign-modulated sub-stream 326 of analog samples $A_{SM2}$. The period of the stream 304 is $T_S$, which is shorter than the period $2T_S$ of the sub-stream 318 of analog samples $A_{P2}$ and also shorter than the period $2T_S$ of the sub-stream 320 of analog samples $A_{P2}$. In another example, the stream 504 of analog samples A is equivalent to either (i) the stream 548 of samples $A_J$, which is based on a sum of the sub-stream 520 of analog samples $A_{P1}$ and the sign-modulated sub-stream 538 of analog samples $A_{SM2}$, or (ii) the stream 550 of samples $A_K$, which is based on a sum of the sub-stream 530 of analog samples $A_{P3}$ and the sign-modulated sub-stream 542 of analog samples $A_{SM4}$. The period of the stream 504 is $T_S$, which is shorter than the period $4T_S$ of the sub-streams 520, 524, 530, 534 of analog samples $A_{P2}$, $A_{P2}$, $A_{P3}$, $A_{P4}$, respectively. In yet another example, the stream 704 of analog samples A is generated based on a sum of the sub-stream 318 of analog samples $A_{P1}$ and the sign-modulated sub-stream 738 of analog samples $A_{SM2}$ (as well as the other sign-modulated sub-streams 744 and 750). The period of the stream 704 is $T_S$, which is shorter than the period $8T_S$ of the sub-stream 720 of analog samples $A_{P1}$ and also shorter than the period $8T_S$ of the sub-stream 724 of analog samples $A_{P2}$. It may similarly be shown that the period of the output stream 904 is shorter than the periods of the sub-streams 925, 926, 927, 928, 939, 940, 941, 942, and also that the period of the stream 1004 is shorter than the periods of the sub-streams 1025, 1026, 1027, 1028, 1029, 1030, 1031, 1032.

According to some examples, the method 1100 may further comprise generating one or more additional sub-streams of periodic analog samples from the stream of periodic digital samples, each additional sub-stream comprising substantially stable time intervals; generating at least one additional sign-modulated sub-stream from the one or more additional sub-streams by effecting sign transitions during stable time intervals of at least one of the one or more additional sub-streams; and generating the output stream as a function of the at least one additional sign-modulated sub-stream.

According to one example, a plurality of input streams may be generated from at least the first sub-stream, the sign-modulated sub-stream, and the one or more additional sign-modulated sub-streams, and the output stream may be generated by applying a multiplexing operation to the plurality of input streams. For example, where the plurality of input streams comprise the streams 953 and 955 (which are generated, respectively, from the sub-streams 925, 935, 936, 937 and 939, 949, 950, 951), the output stream 904 is generated by applying the analog multiplexing operation 956 to the streams 953 and 955.

According to another example, the output stream may be generated from a sum of the first sub-stream, the sign-modulated sub-stream, and the at least one additional sign-modulated sub-stream. For example, where the first and second sub-streams generated at 1102 comprise the sub-streams 720 and 724, respectively, and where the sign-modulated sub-stream generated at 1104 comprises the sub-stream 738, the additional sign-modulated sub-streams may comprise the sub-streams 744 and 750. In this case, the output stream 704 is generated from a sum of first sub-stream 720, the sign-modulated sub-stream 738, and the additional sign-modulated sub-streams 744 and 750.

By employing the mechanisms described above with respect to FIGS. 3 through 9, each of the DACs 300, 500, 700, 900, and 1000 is operative to produce a high-bandwidth analog signal at a sampling rate of $\sim F_S$ using clock signals operating at rates lower than $F_S$. It is much easier for a sub-DAC to convert digital samples to analog samples when controlled by a slower clock signal than when controlled by a fast clock signal, and the sub-DAC will consume less heat when controlled by the slower clock signal than when controlled by the fast clock signal.

A potential advantage of the example DACs 300, 700, and 1000 is that the sub-DACs and sign modulation components are controlled by clock signals operating at a single frequency. The example DACs 500 and 900 rely on multiple clock signals operating at different frequencies, namely, one frequency to control the sub-DACs and sign modulation components, and another higher frequency to control the AMUX. However, this increased complexity may increase resilience to distortions as well as time mismatches between sub-DACs.

Alternative DAC architectures are contemplated. For example, an alternative implementation of DAC 500 may use a first AMUX component on the sub-streams 520, 530 and a second AMUX component on the sub-streams 524, 534, each AMUX component controlled by a clock signal of frequency $\sim F_S/4$. A sign modulation operation, controlled by another clock signal of frequency $\sim F_S/4$, may be applied to the sub-stream output by the second AMUX, thereby resulting in a sign-modulated sub-stream. A summation operation may then be used to combine the sign-modulated sub-stream with an output of the first AMUX component. It is noted that this alternative implementation of the DAC 500 would require the sign modulation operation to be controlled by a higher-frequency clock signal (i.e., $\sim F_S/4$ rather than frequency $\sim F_S/8$).

In a similar manner, an alternative implementation of DAC 900 may use four parallel AMUX components applied to the sub-streams 925, 939 and 926, 940 and 927, 941 and 928, 942, respectively, where each AMUX component is controlled by a clock signal of frequency $\sim F_S/8$. In this case, three sign modulation operations, controlled by three other clocks of frequency $\sim F_S/8$, may be applied to the sub-streams output by the latter three AMUX components, thereby resulting in three sign-modulated sub-streams. A summation operation may then be used to combine the three sign-modulated sub-streams with the output of the first AMUX component. It is noted that this alternative implementation of the DAC 900 would require the sign modulation operations to be controlled by higher-frequency clock signals (i.e., $\sim F_S/8$ rather than frequency $\sim F_S/16$).

In general, the DAC architectures and methods described throughout this document are merely examples, and should not be considered necessarily limiting. Labels such as "first", "second", "third", etc., as well as subscripts such as "1", "2", "3", etc., are used merely for ease of explanation. It is also noted that the sub-streams generated by the pre-processing operations 306, 506, 706, 906, 1006 are merely examples of the various sub-streams that might be generated from the digital samples of the streams 302, 502, 702, 902, 1002, respectively. Any given sample of a preprocessed sub-stream of digital samples may be generated from any two (or more) samples of the original digital signal provided that, in combination with the various sub-DACs, sign-modulation components, summation operations and/or AMUX components, the DAC is operative to convert the original digital signal to an output analog signal using clock frequencies that are lower than the frequency of the analog signal.

Linear digital filtering of the sub-streams of digital samples may adapt the signals in each sub-stream to obtain a cleaner output from the DAC. This may become more important when the DAC is physically further away from the sources of the sub-streams. The linear digital filtering may be calibrated in the factory. Alternatively, local or remote feedback may be used to dynamically control the linear digital filtering.

Nonlinear compensation may be included in the generation of the sub-streams, for example, as described in U.S. Pat. No. 6,781,537 to Taraschuk et al., without memory, or with memory (time delays) in the response. This nonlinear compensation may compensate for nonlinearity in the DACs or in downstream elements.

The techniques described in this document may be used to convert integer sub-streams into a voltage stream, in CMOS. However, other instantiations may be used. For example, current sub-streams may be converted to an optical E-Field stream, as was described in U.S. Pat. No. 7,277,603 to Roberts et al. An integer sub-stream may be combined with a voltage sub-stream to produce a voltage stream. The analog characteristic of the stream that is being created may be an optical or electrical phase, or other modulation of an input analog signal.

The scope of the claims should not be limited by the details set forth in the examples, but should be given the broadest interpretation consistent with the description as a whole.

What is claimed is:

1. An apparatus comprising:
    circuitry configured to generate, from a stream of periodic digital samples, a first sub-stream of periodic analog samples and a second sub-stream of periodic analog samples, each sub-stream comprising substantially stable time intervals;
    circuitry configured to generate a sign-modulated sub-stream by applying to the second sub-stream a sign modulation operation effecting a sign transition during a stable time interval of the second sub-stream; and
    circuitry configured to generate an output stream of periodic analog samples based on a sum of the first sub-stream and the sign-modulated sub-stream, wherein a period of the output stream is shorter than periods of the first and second sub-streams.

2. The apparatus as claimed in claim 1, wherein the sign modulation operation effects a plurality of sign transitions during a respective plurality of stable time intervals of the second sub-stream, each sign transition occurring at approximately the middle of a respective stable time interval.

3. The apparatus as claimed in claim 1, wherein the sign modulation operation effects a plurality of sign transitions during a respective plurality of stable time intervals of the second sub-stream, the plurality of sign transitions occurring at regular offset times within the plurality of stable time intervals.

4. The apparatus as claimed in claim 1, wherein each sample of the first sub-stream is generated from a sum of two of the digital samples, and wherein each sample of the second sub-stream is generated from a difference between two of the digital samples.

5. The apparatus as claimed in claim 1, wherein the periods of the first and second sub-streams are equal.

6. The apparatus as claimed in claim 1, further comprising
    circuitry configured to generate one or more additional sub-streams of periodic analog samples from the stream of periodic digital samples, each additional sub-stream comprising substantially stable time intervals;
    circuitry configured to generate at least one additional sign-modulated sub-stream from the one or more additional sub-streams by effecting sign transitions during stable time intervals of at least one of the one or more additional sub-streams; and
    circuitry configured to generate the output stream as a function of the at least one additional sign-modulated sub-stream.

7. The apparatus as claimed in claim 6, further comprising
    circuitry configured to generate a plurality of input streams from the first sub-stream, the sign-modulated sub-stream, and the one or more additional sign-modulated sub-streams; and
    circuitry configured to generate the output stream by applying a multiplexing operation to the plurality of input streams.

8. The apparatus as claimed in claim 6, further comprising
    circuitry configured to generate the output stream from a sum of the first sub-stream, the sign-modulated sub-stream, and the at least one additional sign-modulated sub-stream.

9. The apparatus as claimed in claim 1, wherein the sign modulation operation comprises a multiplexing operation driven by a clock signal.

10. The apparatus as claimed in claim 1, wherein the sign modulation operation comprises multiplication by a substantially square clock signal.

11. A method comprising:
    generating, from a stream of periodic digital samples, a first sub-stream of periodic analog samples and a second sub-stream of periodic analog samples, each sub-stream comprising substantially stable time intervals;
    generating a sign-modulated sub-stream by applying to the second sub-stream a sign modulation operation effecting a sign transition during a stable time interval of the second sub-stream; and
    generating an output stream of periodic analog samples based on a sum of the first sub-stream and the sign-modulated sub-stream, wherein a period of the output stream is shorter than periods of the first and second sub-streams.

12. The method as claimed in claim 11, wherein the sign modulation operation effects a plurality of sign transitions during a respective plurality of stable time intervals of the second sub-stream, each sign transition occurring at approximately the middle of a respective stable time interval.

13. The method as claimed in claim 11, wherein the sign modulation operation effects a plurality of sign transitions during a respective plurality of stable time intervals of the second sub-stream, the plurality of sign transitions occurring at regular offset times within the plurality of stable time intervals.

14. The method as claimed in claim 11, wherein each sample of the first sub-stream is generated from a sum of two of the digital samples, and wherein each sample of the second sub-stream is generated from a difference between two of the digital samples.

15. The method as claimed in claim 11, wherein the periods of the first and second sub-streams are equal.

16. The method as claimed in claim 11, further comprising
generating one or more additional sub-streams of periodic analog samples from the stream of periodic digital samples, each additional sub-stream comprising substantially stable time intervals;
generating at least one additional sign-modulated sub-stream from the one or more additional sub-streams by effecting sign transitions during stable time intervals of at least one of the one or more additional sub-streams; and
generating the output stream as a function of the at least one additional sign-modulated sub-stream.

17. The method as claimed in claim 16, further comprising
generating a plurality of input streams from the first sub-stream, the sign-modulated sub-stream, and the one or more additional sign-modulated sub-streams; and
generating the output stream by applying a multiplexing operation to the plurality of input streams.

18. The method as claimed in claim 16, further comprising
generating the output stream from a sum of the first sub-stream, the sign-modulated sub-stream, and the at least one additional sign-modulated sub-stream.

19. The method as claimed in claim 11, wherein the sign modulation operation comprises a multiplexing operation driven by a clock signal.

20. The method as claimed in claim 11, wherein the sign modulation operation comprises multiplication by a substantially square clock signal.

* * * * *